United States Patent
Yamaguchi et al.

(10) Patent No.: US 9,625,836 B2
(45) Date of Patent: Apr. 18, 2017

(54) INTERFEROMETER, LITHOGRAPHY APPARATUS, AND METHOD OF MANUFACTURING ARTICLE

(71) Applicant: CANON KABUSHIKI KAISHA, Tokyo (JP)

(72) Inventors: Wataru Yamaguchi, Utsunomiya (JP); Takahiro Matsumoto, Utsunomiya (JP); Hideki Ina, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 337 days.

(21) Appl. No.: 14/327,650

(22) Filed: Jul. 10, 2014

(65) Prior Publication Data

US 2015/0022796 A1    Jan. 22, 2015

(30) Foreign Application Priority Data

Jul. 22, 2013 (JP) .................... 2013-152096

(51) Int. Cl.
*G03B 27/54* (2006.01)
*G03F 9/00* (2006.01)
(Continued)

(52) U.S. Cl.
CPC ......... *G03F 9/7034* (2013.01); *G01B 9/0209* (2013.01); *G01B 11/0675* (2013.01); *G03F 7/7085* (2013.01); *G03F 9/7049* (2013.01)

(58) Field of Classification Search
CPC . G01B 11/0675; G01B 9/0209; G03F 9/7034; G03F 9/7049; G03F 9/7065;
(Continued)

(56) References Cited

U.S. PATENT DOCUMENTS

| 5,398,113 A | 3/1995 | de Groot |
| 2007/0086013 A1 | 4/2007 | De Lega et al. |

(Continued)

FOREIGN PATENT DOCUMENTS

JP    2009-204512 A    9/2009

OTHER PUBLICATIONS

Office Action issued in Taiwanese Appln. No. 103122848 mailed May 23, 2016. English translation provided.

*Primary Examiner* — Christina Riddle
(74) *Attorney, Agent, or Firm* — Rossi, Kimms & McDowell LLP

(57) ABSTRACT

An interferometer includes: an optical system configured to generate interfering light by dividing light from a light source, and combining reference light and measurement light; a detector configured to detect the interfering light generated by the optical system; and an optical member configured to give spatial coherence to the light from the light source before the detector detects the light from the light source. The optical member gives higher spatial coherence in a second direction serving as a direction of a line of intersection of a cross section of a beam of the light incident on the optical member, and a plane including optical paths of the light from the light source before being divided by the optical system, the reference light, the measurement light, and the interfering light, than in a first direction perpendicular to the plane.

19 Claims, 11 Drawing Sheets

(51) Int. Cl.
*G03F 7/20* (2006.01)
*G01B 9/02* (2006.01)
*G01B 11/06* (2006.01)

(58) Field of Classification Search
CPC ............. G03F 7/70616; G03F 7/70716; G03F 7/70725; G03F 7/70775; G03F 7/7085
USPC ...... 355/53, 67, 71, 52, 55, 72–77; 356/451, 356/456, 479, 489, 495, 496, 511, 512
See application file for complete search history.

(56) References Cited

U.S. PATENT DOCUMENTS

| | | | |
|---|---|---|---|
| 2008/0088849 A1 | 4/2008 | De Lega et al. | |
| 2009/0225327 A1* | 9/2009 | Maeda .................. | G03F 9/7049 356/496 |
| 2011/0176139 A1* | 7/2011 | Yamaguchi ........ | G01B 9/02044 356/456 |
| 2012/0307258 A1* | 12/2012 | Koerner ............... | G01B 9/0209 356/497 |

* cited by examiner

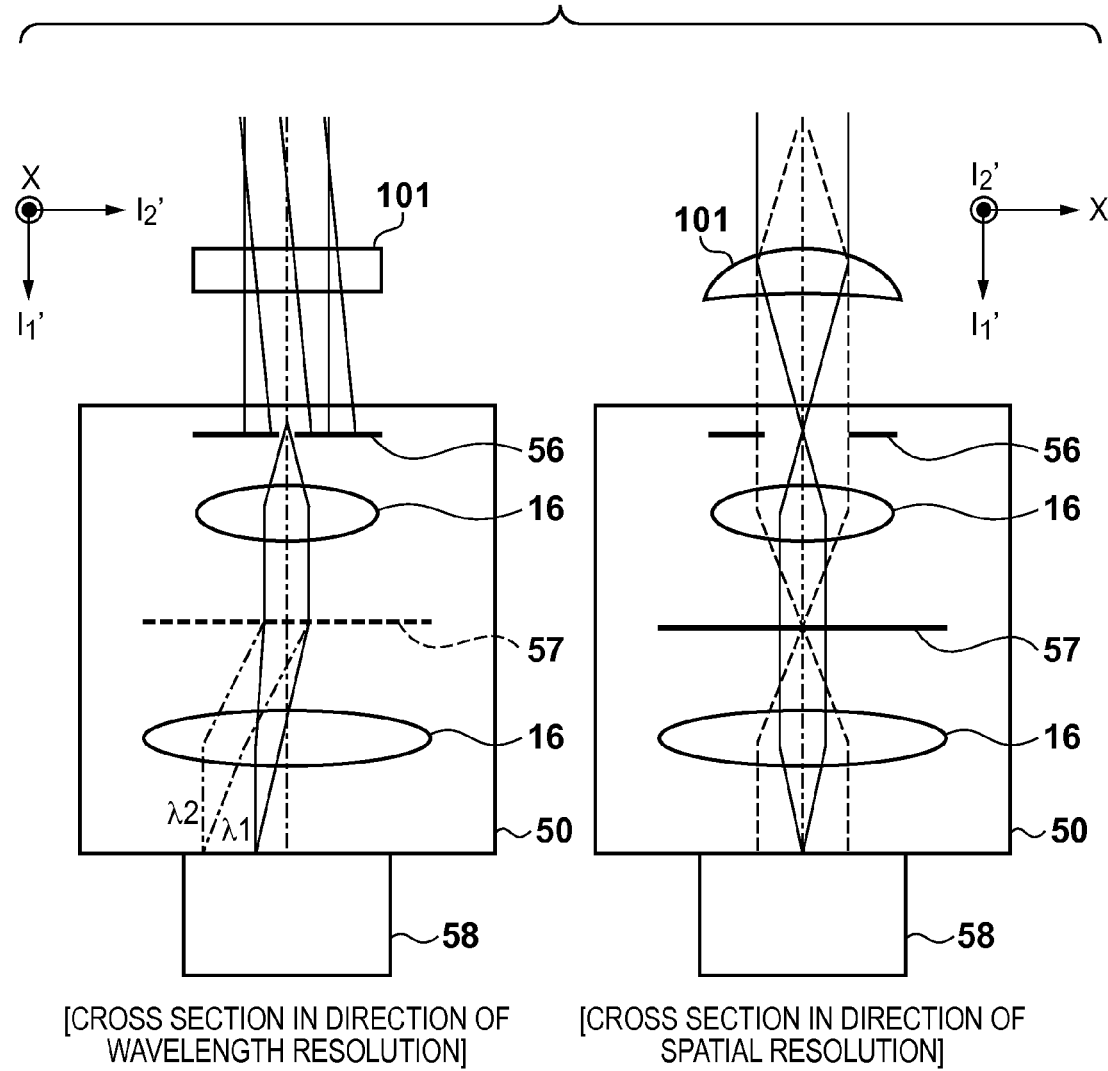

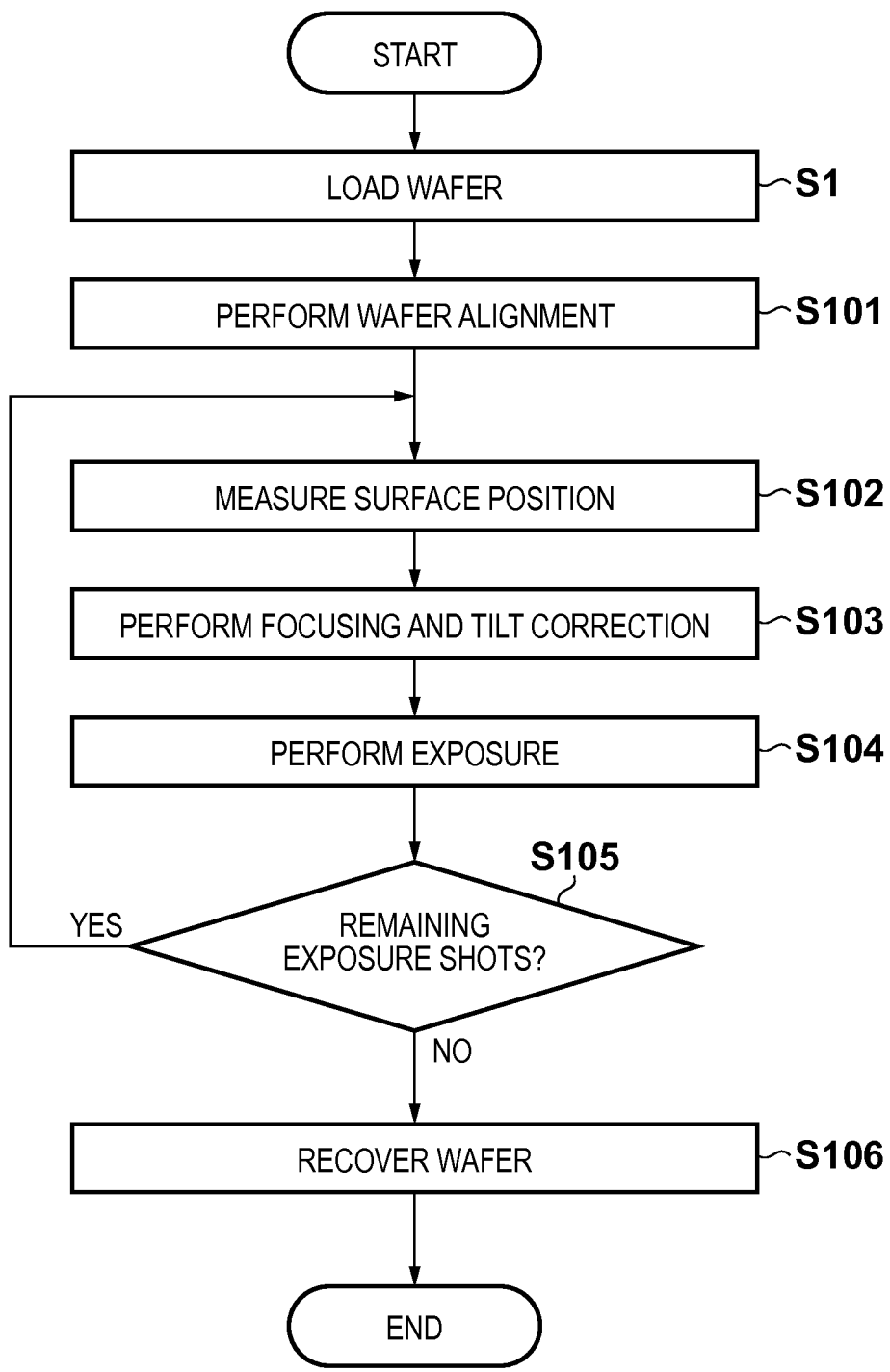

INTERFEROMETER, LITHOGRAPHY APPARATUS, AND METHOD OF MANUFACTURING ARTICLE

BACKGROUND OF THE INVENTION

Field of the Invention

The present invention relates to an interferometer, a lithography apparatus, and a method of manufacturing an article.

Description of the Related Art

A surface shape measurement apparatus using a white light interferometer divides white light emitted by a light source into two by a beam splitter, and makes the two beams obliquely incident on an object to be detected and a reference surface. The measurement apparatus superimposes, by a beam splitter, the measurement light and reference light respectively reflected by the object and reference surface. After that, the measurement apparatus detects a peak position for the interfering light acquired by an image sensor, and measures the surface position of the object. By two effects of a short coherence length unique to a signal of white light interference, and a high reflectance of the substrate surface by oblique incidence, the surface shape measurement apparatus using the white light interferometer can suppress a measurement error arising from film thickness unevenness on the substrate or interference between the front and back surfaces caused by a pattern. US Patent Application Publication No. 2007/0086013 discloses a surface shape measurement apparatus using a spectral white light interferometer.

The measurement apparatus disclosed in US Patent Application Publication No. 2007/0086013 acquires, by using a spectrometer and two-dimensional image sensor, a signal obtained by interference between measurement light traveling from an object to be detected and reference light traveling from a reference surface. A spectral signal obtained from the two-dimensional image sensor via the spectrometer is Fourier-transformed by an arithmetic means. The peak position of the acquired white light interference signal in the time domain is detected to measure the surface position of the substrate. Therefore, the measurement apparatus disclosed in US Patent Application Publication No. 2007/0086013 can quickly measure a surface shape without mechanically scanning an object to be detected in the Z direction at each measurement point on the X-Y plane.

In general, however, a surface shape measurement apparatus using a white light interferometer with a short coherence length has problems of low spatial coherence and a narrow measurement range. The spatial coherence means coherence on a cross section along the optical axis. The coherence includes temporal coherence in addition to the spatial coherence. The spatial coherence represents coherence on the cross section along the optical axis, whereas the temporal coherence represents coherence in the optical axis direction, that is, the range of an interfering optical path length. A problem to be solved by the present invention is directed to the spatial coherence. In an oblique-incidence interferometer, if the position of an object to be detected shifts in the direction of height, measurement light shifts with respect to reference light on the cross section along the optical axis in principle, generating a positional shift (to be referred to as a vertical shift hereinafter). When a low-coherent light source such as a halogen light source or white LED is used, the spatial coherence decreases owing to the vertical shift of measurement light with respect to reference light. Along with the decrease in contrast, the measurement accuracy drops.

To suppress the decrease in spatial coherence along with the vertical shift of measurement light with respect to reference light, there is a method of arranging an aperture stop with a low numerical aperture at the pupil position. The aperture stop with the low numerical aperture is arranged to increase the blur amount of a point image and increase the area by which reference light and measurement light overlap each other on the image plane. This can suppress the decrease in spatial coherence along with the vertical shift of measurement light with respect to reference light. However, when the aperture stop with the low numerical aperture is arranged, the signal strength decreases, and the measurement accuracy drops along with a decrease in the S/N ratio of the signal. Thus, the oblique-incidence white light interferometer has a problem that the measurement accuracy drops owing to the decrease in signal strength when the decrease in spatial coherence along with the vertical shift of measurement light with respect to reference light is suppressed.

US Patent Application Publication No. 2007/0086013 discloses an arrangement in which an aperture stop having a rectangular aperture is arranged at the pupil position in a spectral white light interferometer. However, this literature does not describe the relationship between the shorter side direction of the rectangular aperture and the direction of the line of intersection of the incident surface and beam cross section, and the relationship between the direction of wavelength resolution, and the direction of the line of intersection of the incident surface and beam cross section in the spectrometer. These relationships are very important to implement high-accuracy measurement in the spectral white light interferometer. Hence, the contents of the description in US Patent Application Publication No. 2007/0086013 are insufficient to measure the surface shape of an object to be detected at high accuracy.

SUMMARY OF THE INVENTION

The present invention provides an interferometer which measures an object to be detected at high accuracy.

The present invention provide an interferometer comprising: an optical system configured to generate interfering light by dividing light from a light source, and combining reference light generated by reflecting one beam of the divided light by a reference surface, and measurement light generated by making the other beam of the divided light obliquely incident on an object to be detected and reflecting the other beam by the object; a detector configured to detect the interfering light generated by the optical system; and an optical member configured to give spatial coherence to the light from the light source before the detector detects the light from the light source, wherein the optical member gives higher spatial coherence in a second direction serving as a direction of a line of intersection of a cross section of a beam of the light incident on the optical member, and a plane including optical paths of the light from the light source before being divided by the optical system, the reference light, the measurement light, and the interfering light, than in a first direction perpendicular to the plane.

Further features of the present invention will become apparent from the following description of exemplary embodiments with reference to the attached drawings.

BRIEF DESCRIPTION OF THE DRAWINGS

FIG. 8 is a view showing the arrangement of the interferometer according to the second embodiment;

FIG. 11 is a flowchart showing the sequence of measurement and exposure by the exposure apparatus.

DESCRIPTION OF THE EMBODIMENTS

Figure 1:
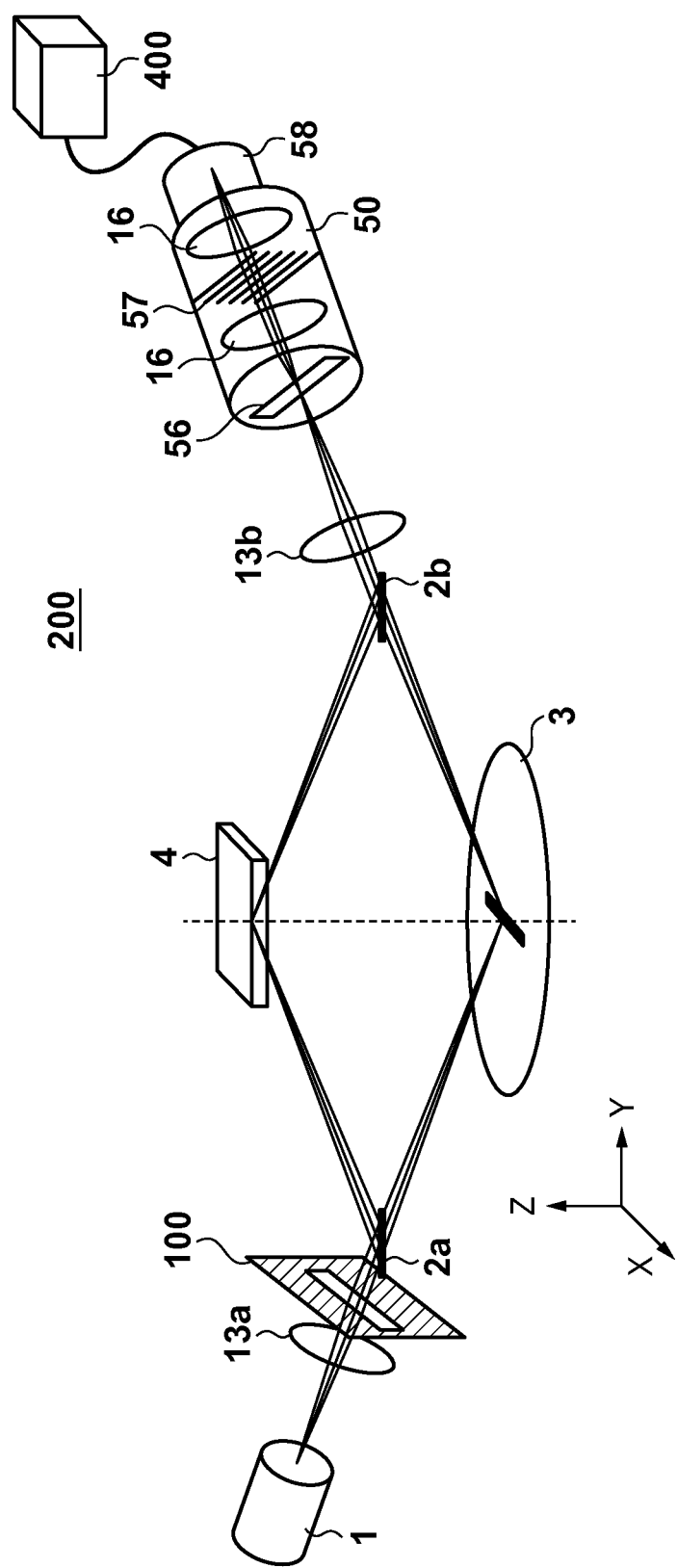
FIG. 1 is a view showing the arrangement of an interferometer according to the first embodiment.

Embodiments of the present invention will now be described with reference to the accompanying drawings. In the drawings, the same reference numerals denote the same parts, and a repetitive description thereof will be omitted. White light and light emitted by a white light source described in the following embodiments mean light having broadband wavelengths, and are not always limited to light in the visible region (400 nm to 800 nm). Needless to say, the present invention is applicable to, for example, even optical coherence tomography (OCT) using light (for example, SLD) in the near infrared wavelength band.

First Embodiment

FIG. 1 is a schematic view showing the arrangement of an interferometer 200 which measures the surface shape of an object to be detected in the first embodiment of the present invention. The first embodiment will explain a case in which an aperture stop 100 is used to generate spatial coherence. The interferometer 200 is an apparatus which detects the position of a substrate (wafer) 3 serving as an object to be detected in the direction of height (Z direction) while scanning the substrate 3 in one direction (Y direction). The interferometer 200 includes a light source 1 which is constituted by a halogen lamp or LED (including a white LED) and emits broadband light (white light), a lens 13a, the aperture stop 100, a beam splitter 2a, a reference surface 4, a lens 13b, and a spectrometer 50. The interferometer 200 also includes a two-dimensional image sensor (detector) 58, and a processor 400 which processes an electrical signal of interfering light detected by the two-dimensional image sensor 58.

The functions of the respective building elements and the embodiment will be explained. In FIG. 1, broadband light emitted by the light source 1 passes through the aperture stop 100, and is split into two beams of almost the same light amount by the beam splitter 2a. One beam is obliquely incident on the reference surface 4, and the other beam is obliquely incident on the substrate 3. A beam splitter 2b combines measurement light reflected by the substrate 3 and reference light reflected by the reference surface 4. The spectrometer 50 and two-dimensional image sensor 58 receive the generated interfering light. The spectrometer 50 is constituted by an incident slit 56, a spectral unit 57 (for example, a diffraction grating), and an imaging optical system 16 (mirror optical system). The spectrometer 50 makes light having passed through the incident slit 56 be incident on the diffraction grating 57. By using the diffraction grating 57, the spectrometer 50 diffracts interfering light once for each wavelength in the shorter side direction of the incident slit 56, obtaining a spectral signal having a spread in the direction of spatial resolution and a spread in the direction of wavelength resolution. The two-dimensional image sensor 58 receives the spectral signal as one-dimensional position information and wavelength information.

For example, when measuring the shape of the upper surface of a resist on the substrate 3 coated with a semi-transparent film such as a resist, the incident angle with respect to the substrate 3 can be set to be equal to or larger than the Brewster's angle of the resist, in order to increase the reflectance of the upper surface of the resist. For example, an incident angle $\theta_{in}$ can be set to be equal to or larger than 60°. This is because, for example, the intensity of light reflected by the upper surface becomes relatively strong as the incident angle increases. For example, when a thin film (for example, resist) of about several hundred nm is deposited on the substrate 3, light received by the light receiving system contains light reflected by the upper surface of the resist and light reflected by the lower surface of the resist.

As a method of measuring light reflected by the upper surface of the resist and light reflected by the lower surface of the resist, there is proposed a method of increasing the incident angle with respect to the substrate 3 to increase the reflectance on the upper surface of the resist. According to this method, light reflected by the upper surface of the resist can be detected to be stronger than light reflected by the lower surface of the resist. This has a special effect particularly when light is incident on a thin film on the substrate 3 at an incident angle equal to or larger than the Brewster's angle (also called a deflection angle). This special effect will be explained below. Light of the p-polarized light component has a feature in which the phase shifts by π at the boundary of the Brewster's angle. For example, when the refractive index of the resist is 1.5, the Brewster's angle at the air/resist interface is 56.3°. When the substrate is made of Si and the refractive index is 3.8, the Brewster's angle at the resist/substrate interface is 68.5°. For example, when the incident angle is 60°, the incident angle with respect to the substrate 3 from the resist is 35° by using Snell's law, which is smaller than the Brewster's angle at the resist/substrate interface. Further, even when the incident angle is set to be 89° and light is incident on the substrate 3 at an incident angle almost parallel to the substrate 3, the incident angle with respect to the substrate 3 from the resist is 41°, which is also smaller than the Brewster's angle at the resist/substrate interface.

Therefore, when light of the p-polarized light component is incident at an incident angle equal to or larger than the incident angle at the air/resist interface, the phase shifts by π between light reflected by the upper surface of the resist and light reflected by the resist/substrate interface. To the contrary, the phase of light of the s-polarized light component does not change before and after the Brewster's angle. As a result, the phase of interfering light generated by light reflected at the resist/substrate interface shifts by π between the p-polarized light and the s-polarized light. When unpolarized light is used, the interfering light is given by the sum of interfering light of the p-polarized light and interfering light of the s-polarized light. Thus, interfering light generated by light reflected at the resist/substrate interface is canceled, resulting in a low-contrast signal. Compared to interfering light generated by light reflected by the upper surface of the resist, interfering light generated by light reflected at the resist/substrate interface becomes a lower-contrast signal. Hence, the accuracy of shape measurement of the upper surface of the resist is improved. At this time, if light is incident at the Brewster's angle of the resist, p-polarized light reflected by the upper surface of the resist disappears, so the incident angle can be increased to be at least equal to or larger than 60°. For details, see Japanese Patent Laid-Open No. 2009-204512.

As the wavelength band of the light source 1, a wavelength of 400 nm to 800 nm is usable. However, the wavelength band of the light source 1 is not limited to this range, and a band of 100 nm or more is usable. When a resist is formed on the substrate 3, the substrate 3 is not irradiated with light of a wavelength equal to or shorter than ultraviolet light (350 nm), in order to prevent exposure of the resist. The beam splitter 2a can be a cubic beam splitter in which a film such as a metal film or a dielectric multilayered film is used as a split film, or a pellicle beam splitter formed from a film as thin as about 1 μm to 10 μm (material is SiC, SiN, or the like).

The reference surface 4 can be a glass plane mirror having a profile irregularity of about 5 nm to 20 nm. When a resist is formed on the substrate 3, a material such as $SiO_2$, SiN, or SiC having a refractive index almost equal to that of the resist film is usable as the substrate of the reference surface 4 and a film on the substrate. Since the coherence length in white light interference is as short as several μm, a substrate having a thickness of several μm or more can be used for the reference surface 4 so as to prevent interference of light reflected by the lower surface. Alternatively, a substrate is desirably used, on which a film having a refractive index almost equal to that of a film on a substrate to be measured is deposited to have a thickness of several μm or more.

The spectrometer 50 in the first embodiment can be a general Czerny-Turner type. As another arrangement for guiding interfering light to the spectrometer 50, a fiber is usable. The two-dimensional image sensor 58 may acquire a spectral signal by forming interfering light into an image at the incident end of the fiber and guiding, to the spectrometer 50, light emerging from the exit end of the fiber. In the first embodiment, as the spectral unit 57, a dispersing prism may be used instead of the diffraction grating. When the dispersing prism is used, a transmission slit plate or the like is used to define the measurement range of light emitted by the light source 1, and the surface position can be measured at high accuracy.

The lens 13a has a function of imaging the light source 1 on the substrate 3. The lens 13b has a function of forming, again on the two-dimensional image sensor 58, the light source image which has been projected on the substrate 3 through the lens 13a. The lenses 13a and 13b may be constituted by reflecting mirrors.

As the two-dimensional image sensor 58, for example, a two-dimensional CCD is used. The two-dimensional CCD obtains image information by transferring and reading out charges generated by the photoelectromotive force of a photodiode. Depending on the charge transfer method, an interline transfer type and frame transfer type are known. Of these types, a frame transfer readout circuit having a high S/N ratio of the signal is employed in the first embodiment in which spectral measurement is performed, because the aperture ratio and sensitivity are high. In the frame transfer two-dimensional CCD, received light is accumulated as charges in respective pixels, and then all the charges are transferred and read out, ending readout of one frame. When the surface shape of the substrate 3 is measured by the spectral method, it is desirable to, for example, arrange a transmission slit plate 30 so that the longer side direction of the slit becomes the X direction, and to scan a substrate stage WS in the Y direction. The position of the substrate 3 in the direction of height (Z direction) can be detected by acquiring a spectral signal in the range in which the substrate stage WS moves till the end of image sensing of one frame by using the two-dimensional image sensor 58. When measurement is performed in the entire region of the substrate 3, an operation of scanning the substrate stage WS in a predetermined direction (Y direction), and stepping the substrate stage WS by ΔX in a direction (X direction) perpendicular to the scanning direction is repetitively performed. As the two-dimensional image sensor 58, a plurality of one-dimensional line sensors may be arranged in the direction of spatial resolution (X direction) to receive interfering light as one-dimensional position information (X direction) and wavelength information, and detect the position of the substrate 3 in the direction of height (Z direction), instead of using the two-dimensional CCD.

Figure 2:
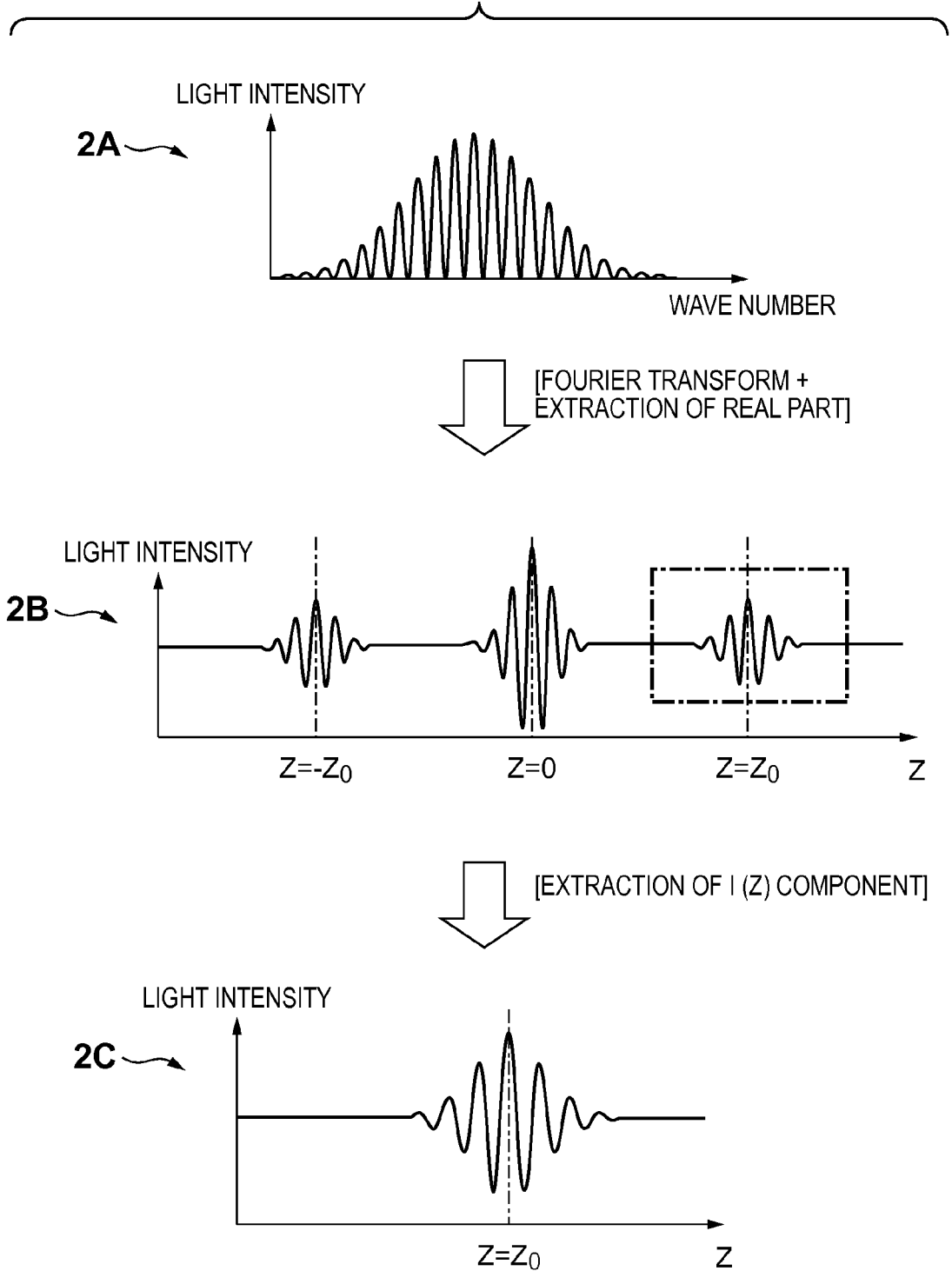
FIG. 2 is a view showing a signal processing method in the interferometer.

Subsequently, a method of processing an interference signal received by the two-dimensional image sensor 58 to obtain the shape of the substrate 3 will be explained. In FIG. 2, 2A shows an example of a spectral signal received by the two-dimensional image sensor 58. The abscissa represents the wave number, and the ordinate represents the light intensity output. By diffracting interfering light for each wavelength by using the spectrometer 50, the two-dimensional image sensor 58 detects a spectral signal obtained by converting an optical path length difference between reference light and measurement light into a frequency difference. The processor 400 performs Fourier transform on the spectral signal to convert the signal from the frequency domain into the real spatial domain and then extract a real part (2B in FIG. 2). In 2B of FIG. 2, the abscissa represents a measurement value corresponding to the direction of height (Z-axis direction) of the substrate, and the ordinate represents a light intensity output from the two-dimensional image sensor 58. When an optical path length difference $Z_0$ in the range of the coherence length exists between reference light and measurement light, a white light interference signal appears at positions of Z=0 and $Z=\pm Z_0$ in the Z direction along the abscissa. The interval between maximum peak positions is equivalent to the optical path length difference between reference light and measurement light. By detecting the peat position $Z=Z_0$, surface height information of the substrate 3 is acquired (spectral method).

In FIG. 2, 2C is a graph showing extraction of a white light interference signal at the position of $Z=Z_0$, and this graph is also called an interferogram. The position of the signal peak of the white light interference signal is calculated, and a corresponding measurement value in the Z direction serves as a height measurement value in the pixel. In calculation of the signal peak position, approximation to a curve (for example, a quadratic function) is performed based on the signal peak position and data at several preceding and succeeding points. This makes it possible to calculate a peak position at a resolution of 1/10 or less of a sampling pitch Zp along the Z-axis serving as the abscissa in 2C of FIG. 2. As a method of detecting a peak position, FDA (Frequency Domain Analysis), which is a well-known technique disclosed in U.S. Pat. No. 5,398,113, is also available. In the FDA method, the peak position of a white light interference signal is obtained by using the phase gradient of the Fourier spectrum. In measurement using the white light interferometer, a key to determine the resolution is how accurate the peak position of the white light interference signal is obtained. Thus, in addition to the FDA method, several fringe analysis methods have been proposed as known techniques, including a phase crossing method, and a method of obtaining the envelope of a white light interference fringe by a phase shift method or Fourier transform method, and obtaining a peak position from the maximum position of the fringe contrast. These methods are applicable to the first embodiment.

In this manner, the processor 400 processes spectral signals on the two-dimensional image sensor 58 that correspond to the X direction of the substrate 3 in FIG. 1, and can obtain at once height information on the slit extending in the X direction at a given position in the Y direction on the substrate. By scanning the substrate 3 at a constant speed in the Y direction by a stage (not shown), the processor 400 can measure the surface shape of the substrate 3 in the Y direction at a measurement pitch determined by the frame rate of the two-dimensional image sensor 58. The simultaneously measurable region in the X direction is determined by the imaging magnification of the lens 13b and the size of the two-dimensional image sensor 58. The substrate 3 is stepped by the amount of the detection region in the X direction by an X stage (not shown) in accordance with the size of the substrate 3 serving as an object to be detected, and then the substrate 3 is scanned in the Y direction. By repeating this operation, the processor 400 can obtain height information of the entire surface of the substrate 3.

Figure 3:
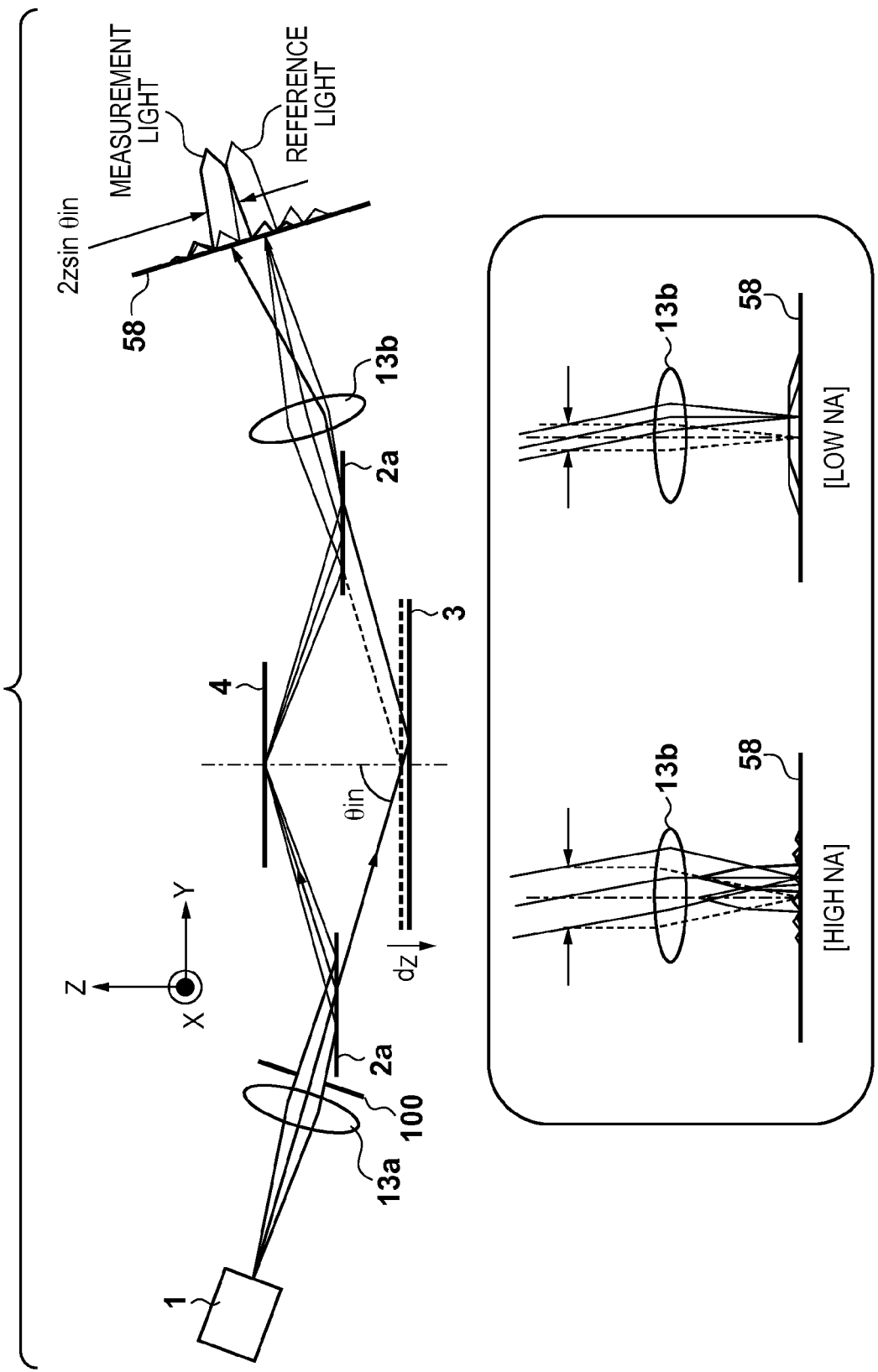
FIG. 3 is a view showing the relationship between the spatial coherence and the numerical aperture.

The relationship between the spatial coherence and the aperture stop 100, which is a feature of the present invention, will be described. First, a decrease in spatial coherence will be explained. FIG. 3 is a view showing the relationship between the numerical aperture of the aperture stop 100 and the spatial coherence. In FIG. 3, light emitted by the light source 1 is projected on the substrate 3 and reference surface 4 through the lens 13a and forms, on the two-dimensional image sensor 58 through the lens 13b, an image on the substrate 3 and an image on the reference surface 4. When the substrate 3 is displaced by dz in the Z direction, a displacement amount Z1 of measurement light with respect to reference light on the two-dimensional image sensor 58 can be given by:

$$Z1 = 2dz \cdot \sin(\theta_{in}) \quad (1)$$

where $\theta_1$, is the incident angle on the substrate 3. For descriptive convenience, the imaging magnifications of the imaging optical systems 13a and 13b are 1. For measurement light in FIG. 3, only a principal ray is shown.

The low-coherent light source 1 can be regarded as a set of point light sources. Light emitted by one point light source is divided into reference light and measurement light, and only when these point images overlap each other, interference of light occurs. A point image intensity distribution I(r) at the imaging position of the lens 13b is an intensity distribution in Fraunhofer's diffraction of the circular aperture of the aperture stop. Letting NA be the numerical aperture of the aperture stop 100, the intensity distribution I(r) can be given by:

$$I(r) = [2J_1\{(2\pi/\lambda)NAr\}/\{(2\pi/\lambda)NAr\}]^2 \quad (2)$$

where r is the radius on the image plane, $\lambda$ is the wavelength, and $J_1$ is the first-order Bessel function of the first kind. Equation (1) is an equation which normalizes the peak intensity to 1. Further, the value $r_0$ of r at which the intensity of a diffracted image becomes 0 for the first time is given by:

$$r_0 = 0.61\lambda/NA \quad (3)$$

Equation (3) represents the radius of the Airy disk (Airy image). If a displacement amount Z1 of measurement light with respect to reference light exceeds the diameter of the Airy disk, the point images of reference light and measurement light do not overlap each other, and interference of light does not occur. A conditional expression that interference occurs is given by using equations (1) and (3):

$$NA \leq 0.61\lambda/\{\sin(\theta_{in})dz\} \quad (4)$$

Expression (4) is a condition that interference occurs. Even in this range, however, a positional shift of measurement light on the beam cross section with respect to reference light occurs along with displacement of the substrate 3 in the direction of height, decreasing the spatial coherence. The decrease in spatial coherence results in a low signal contrast and a low S/N ratio of the signal. Considering this, expression (5) is also usable as a conditional expression in which a positional shift of measurement light on the beam cross section with respect to reference light becomes equivalent to the radius of the Airy disk:

$$NA \leq 0.305\lambda/\{\sin(\theta_{in})dz\} \quad (5)$$

In the oblique-incidence interferometer, the numerical aperture NA which satisfies expression (4) or (5) needs to be set, in order to suppress a decrease in spatial coherence along with a positional change of the substrate 3 in the Z direction. In expressions (4) and (5), when a light source configured to emit broadband light is used, the center wavelength $\lambda c$ is set to be $\lambda$ ($\lambda = \lambda c$). When the measurement range of the interferometer 200 is designed to be ±Zr, the numerical aperture NA is decided to satisfy expression (4') or (5') in which Zr is substituted into dz in expression (4) or (5):

$$NA \leq 0.61\lambda c/(Zr \cdot \sin \theta_{in}) \quad (4')$$

$$NA \leq 0.305\lambda c/(Zr \cdot \sin \theta_{in}) \quad (5')$$

FIG. 3 shows a comparison of the point image intensity distribution between a mode (high NA) in which the spatial coherence is low and a mode (low NA) in which it is high. For a high NA, the peak intensity of the point image intensity function is relatively high, but the radius is small. Thus, the range in which measurement light and reference light overlap each other is narrow, and the spatial coherence decreases. In contrast, for a low NA, the blur amount of the point image is large, and the range in which measurement light and reference light overlap each other is wide. For a low NA, therefore, a decrease in spatial coherence can be suppressed, and a wide Z range (height range) is obtained. However, since the NA is low, the peak intensity of the point image distribution function decreases, and the measurement accuracy drops. The measurement accuracy drops for a low NA because it is readily influenced by dark current noise, readout noise, or shot noise of the two-dimensional image sensor as the signal strength decreases.

The embodiment adopts an optical system (spatial coherence generator) which gives different spatial coherences in the first and second directions perpendicular to each other on the beam cross section of the optical system. By using the spatial coherence generator, the embodiment suppresses a decrease in spatial coherence along with displacement of the object 3 in the direction of height, and acquires a high-contrast, high-brightness interference signal. The first embodiment uses the aperture stop 100 as the spatial coherence generator. The first embodiment will describe a case in which, for example, a rectangular slit aperture having different lengths (inner diameters) in two directions perpendicular to each other on the beam cross section is used as the aperture stop 100.

The orientation of the aperture stop 100 having a rectangular aperture is set so that the shorter side direction of the aperture of the aperture stop 100 coincides with the direction of the line of intersection of the incident surface and beam cross section on the object 3. The spectral unit 57 is arranged so that the direction of the line of intersection of the incident surface and beam cross section coincides with the direction of wavelength resolution. The orientation of the rectangular slit aperture 100 in the oblique-incidence interferometer will be described.

Figure 4:
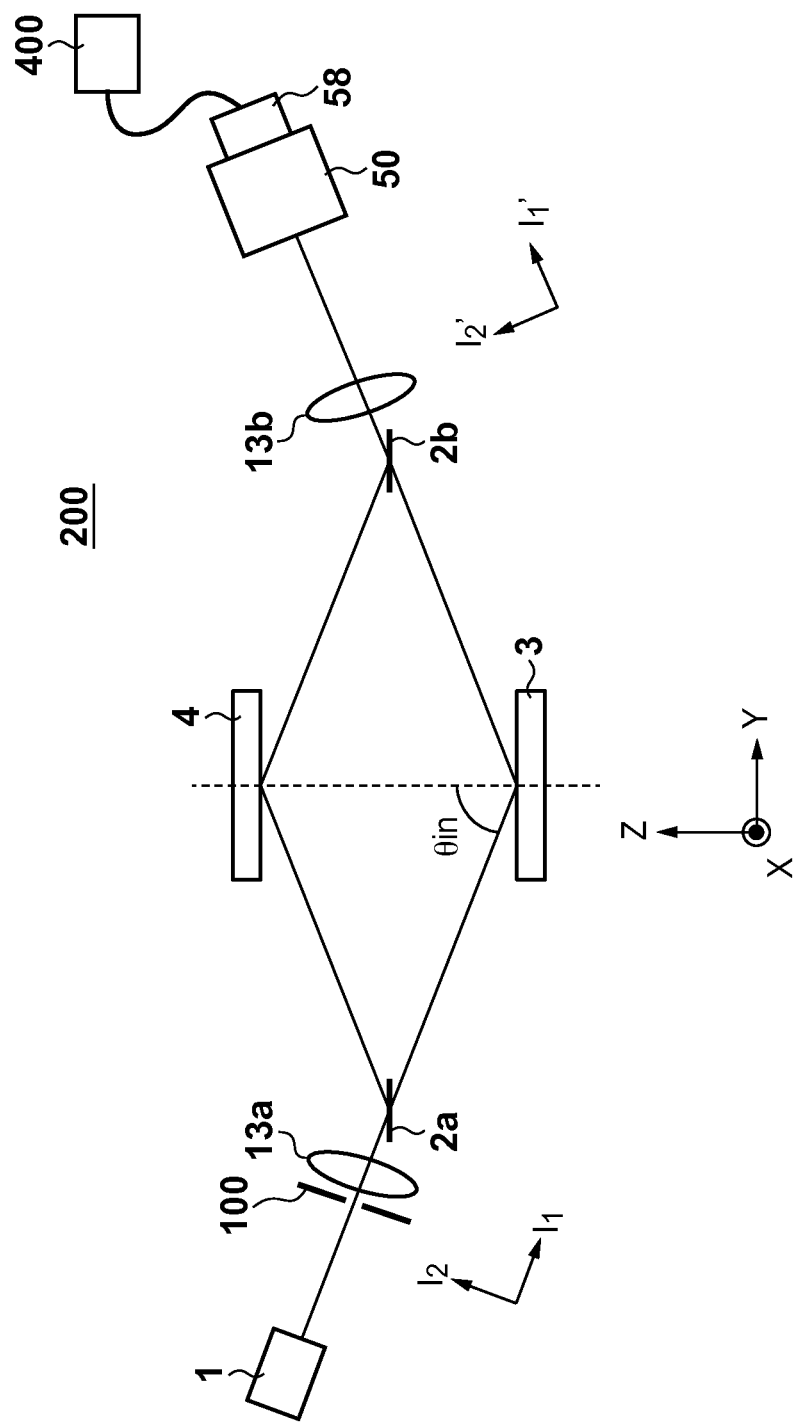
FIG. 4 is a view showing an arrangement on the Y-Z plane in FIG. 1.

The direction of the line of intersection of the incident surface and beam cross section, which represents the orientation of the aperture stop 100, will be explained. FIG. 4 shows the arrangement of the interferometer 200 in FIG. 1 on the Y-Z plane. The incident surface means a plane including incident light and reflected light on the substrate 3, and represents the Y-Z plane in FIG. 4. The incident surface is also a plane including the optical paths of broadband light, reference light, measurement light, and interfering light. The beam cross section means a plane perpendicular to a beam, and represents different planes for the beam cross sections of incident light and reflected light on the substrate 3 in the oblique-incidence interferometer. In FIG. 4, the optical axis direction when light emitted by the light source 1 is incident on the substrate 3 is defined as an direction, and a direction perpendicular to the optical axis direction and X direction is defined as an $I_2$ direction. The $I_2$ direction is equivalent to a direction rotated by the incident angle $\theta_{in}$ from the Y direction on the Y-Z plane. When light emitted by the light source 1 is incident on the substrate 3, the beam cross section serves as an $I_2$-X plane defined by the $I_2$ direction and X direction. Hence, the direction (second direction) of the line of intersection of the incident surface (Y-Z plane) and beam cross section ($I_2$-X plane) means the $I_2$ direction. This also applies to a case in which light reflected by the substrate 3 is guided to the spectrometer 50. The optical axis direction is defined as an direction, and a direction perpendicular to the optical axis direction and X direction is defined $I_2'$. Then, the $I_2'$ direction is equivalent to a direction rotated by the incident angle $(180°-\theta_{in})$ from the Y direction on the Y-Z plane. The direction of the line of intersection of the incident surface and beam cross section means the $I_2'$ direction serving as the direction of the line of intersection of the Y-Z plane and $I_2'$-X plane.

Subsequently, the relationship between the shorter side direction of the aperture of the aperture stop 100, and the direction ($I_2$ direction) of the line of intersection of the incident surface and beam cross section will be explained. In the interferometer 200 of FIG. 4, when the position of the substrate 3 shifts in the direction of height (Z direction), a vertical shift is generated in the $I_2'$ direction between reference light and measurement light which are superimposed by the beam splitter 2b, thus decreasing the spatial coherence. When the shorter side direction of the aperture of the aperture stop 100 is made to coincide with the direction of the line of intersection ($I_2$ direction) of the incident surface and beam cross section, the blur amounts of images of reference light and measurement light superimposed by the beam splitter 2b increase in the $I_2'$ direction, increasing the area by which the two images overlap each other. This suppresses a decrease in spatial coherence along with displacement of the substrate 3 in the direction of height. The longer side direction of the rectangular aperture of the aperture stop 100 is parallel to a direction, that is, X direction (first direction) perpendicular to the shorter side direction of the aperture on the beam cross section. Since an image shift between reference light and measurement light along with displacement of the substrate 3 in the direction of height does not occur in the X direction, low spatial coherence does not matter. When the longer side direction of the aperture of the aperture stop 100 is set to be parallel to the X direction, a beam in a wide range can be captured because of a high numerical aperture. That is, the two-dimensional image sensor 58 can receive interfering light of high signal strength. Therefore, by setting the shorter side direction of the aperture of the aperture stop 100 to be parallel to the direction of the line of intersection ($I_2$ direction) of the incident surface and beam cross section, the two-dimensional image sensor 58 can acquire a high-contrast, high-brightness interference signal.

To the contrary, when the longer side direction of the aperture of the aperture stop 100 is set to be parallel to the direction of the line of intersection ($I_2$ direction) of the incident surface and beam cross section, the blur amounts of images of reference light and measurement light superimposed by the beam splitter 2b become larger in the X direction than in the $I_2'$ direction. Since the blur amounts of images of reference light and measurement light in the $I_2'$ direction are small and the area by which these images overlap each other is small, the spatial coherence decreases along with displacement of the substrate 3 in the direction of height. Further, if the shorter side direction of the aperture of the aperture stop 100 is made to coincide with the X direction in which no vertical shift between reference light and measurement light occurs, the numerical aperture and signal strength decrease. Thus, if the longer side direction of the aperture of the aperture stop 100 is made to coincide with the direction of the line of intersection ($I_2$ direction) of the incident surface and beam cross section, no high-contrast interference signal can be acquired.

From this, the shorter side direction of the aperture of the aperture stop 100 is made to coincide with the direction of the line of intersection ($I_2$ direction) of the incident surface and beam cross section. While suppressing a decrease in spatial coherence, a decrease in signal strength accompanying the arrangement of the aperture stop is suppressed, and high-accuracy measurement can be performed. As for the shorter side direction of the aperture of the aperture stop 100, it is desirable to set a numerical aperture which satisfies expression (4) or (5).

Next, the relationship between the direction of wavelength resolution, and the direction of the line of intersection ($I_2'$ direction) of the incident surface and beam cross section in the spectral unit 57 will be explained. In the oblique-incidence interferometer, when the direction of the line of intersection of the incident surface and beam cross section in the spectral unit 57 is made to coincide with the direction of wavelength resolution, the direction of spatial resolution of the spectral unit 57 coincides with a direction (X direction) perpendicular to the incident surface on the substrate 3. As for the direction of spatial resolution, the image of the substrate 3 can be in focus on the light receiving surface of the two-dimensional image sensor 58. The position in the direction of height (Z direction) in each region in a direction (X direction) perpendicular to the incident surface on the substrate 3 is obtained from a spectral signal acquired by the two-dimensional image sensor 58.

In contrast, when the direction of the line of intersection of the incident surface and beam cross section in the spectral unit 57 is made to coincide with the direction of spatial resolution, the image of the substrate 3 on the surface of the two-dimensional image sensor 58 cannot be in focus in the entire image plane of the spectral unit 57 in the direction of spatial resolution due to the principle of oblique incidence. To perform high-accuracy measurement by making the direction of the line of intersection of the incident surface and beam cross section in the spectral unit 57 coincide with the direction of spatial resolution, the focus needs to be adjusted in the entire image plane by using a shine-proof optical system which satisfies a shine-proof condition. However, the application of the shine-proof optical system has a disadvantage in which the arrangement of the optical system becomes complicated and the optical system is readily influenced by disturbance such as vibrations. To perform high-accuracy measurement in the oblique-incidence interferometer, the direction of the line of intersection of the incident surface and beam cross section in the spectral unit 57 is made to coincide with the direction of wavelength resolution. As for the orientation of the aperture stop 100 having a rectangular aperture, the aperture stop 100 is arranged so that the shorter side direction of the aperture of the aperture stop 100 coincides with the direction of the line of intersection ($I_2$ direction) of the incident surface and beam cross section, and the direction of the line of intersection ($I_2'$ direction) of the incident surface and beam cross section in the spectral unit 57 coincides with the direction of wavelength resolution.

Subsequently, the installation location of the aperture stop 100 in the optical system according to the first embodiment will be explained. As shown in FIG. 1, the aperture stop 100 can be arranged at or near the pupil position of an illumination optical system which illuminates the substrate 3 and reference surface 4 with light emitted by the light source 1. The aperture stop 100 can also be arranged near the pupil position of a light receiving optical system. However, when the aperture stop 100 is arranged near the pupil position of the light receiving optical system, the aperture stop 100 sometimes blocks part of beams of measurement light and reference light owing to an angular shift between the beams of the measurement light and reference light that arises from the tilts of the substrate 3 and reference surface 4. In this case, the signal strength of interfering light received by the two-dimensional image sensor 58 decreases, and the measurement accuracy drops under the influence of dark current noise, readout noise, or shot noise of the two-dimensional image sensor 58. To prevent this, the aperture stop 100 is arranged near the pupil position of the illumination optical system in the first embodiment. When a decrease in signal strength by the angular shift between the beams of the measurement light and reference light that arises from the tilts of the substrate 3 and reference surface 4 is negligibly small, the aperture stop 100 may be arranged near the pupil position of the light receiving optical system which guides, to the spectrometer 50, measurement light and reference light respectively traveling from the substrate 3 and reference surface 4.

Figure 5:
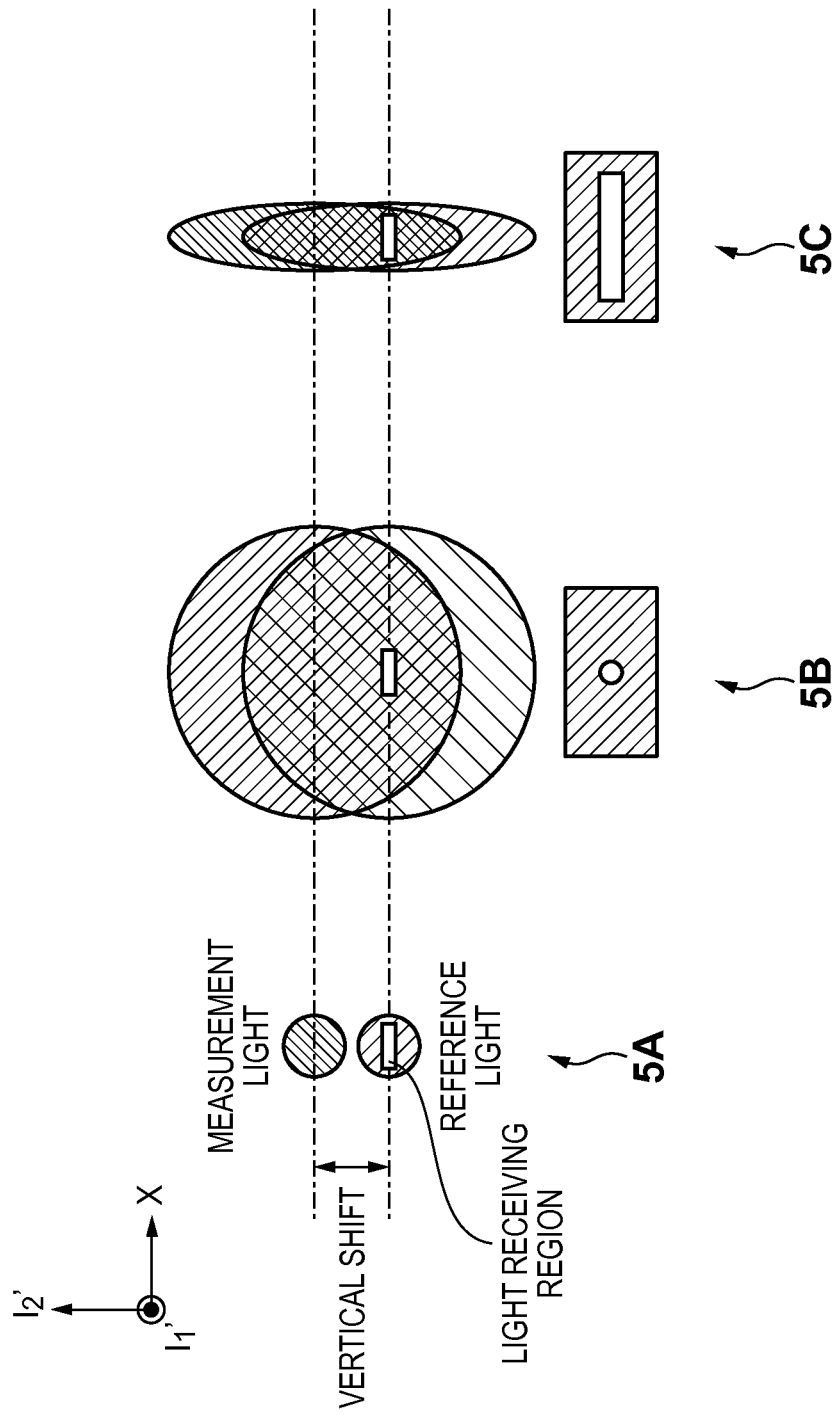
FIG. 5 is a view showing the effect of an aperture stop.

Next, the effects of the rectangular aperture stop 100 in the first embodiment will be described. FIG. 5 is a schematic view showing the images of reference light and measurement light that are incident on the spectrometer 50 when the substrate 3 is displaced in the direction of height. In FIG. 5, 5A shows a case in which no aperture stop is arranged, 5B shows a case in which an aperture stop having a circular aperture is arranged, and 5C shows a case in which an aperture stop having a rectangular aperture is arranged. The light receiving region of the spectrometer 50 is set near the center position of reference light at which the light receiving region is not influenced by displacement of the substrate 3 in the direction of height. When the substrate 3 is displaced in the direction of height, a vertical shift between reference light and measurement light occurs in the direction of the line of intersection ($I_2'$ direction) of the incident surface and beam cross section in the spectral unit 57, thereby decreasing the spatial coherence. In 5A of FIG. 5, the reference light and measurement light do not overlap each other owing to the vertical shift, and do not interfere with each other. In 5B in which the aperture stop having the circular aperture is arranged, the blur amount of a point image increases to suppress a decrease in spatial coherence between reference light and measurement light, but the signal strength decreases owing to a low numerical aperture. The measurement accuracy becomes readily influenced by dark current noise, readout noise, or shot noise of the two-dimensional image sensor 58, and the measurement accuracy drops. In 5C in which the aperture stop having the rectangular aperture is used, the blur amount of a point image is increased in only the $I_2'$ direction in which a vertical shift between reference light and measurement light occurs. While suppressing a decrease in signal strength, a decrease in spatial coherence is also suppressed. Accordingly, a high-contrast interference signal can be acquired.

Figure 6:
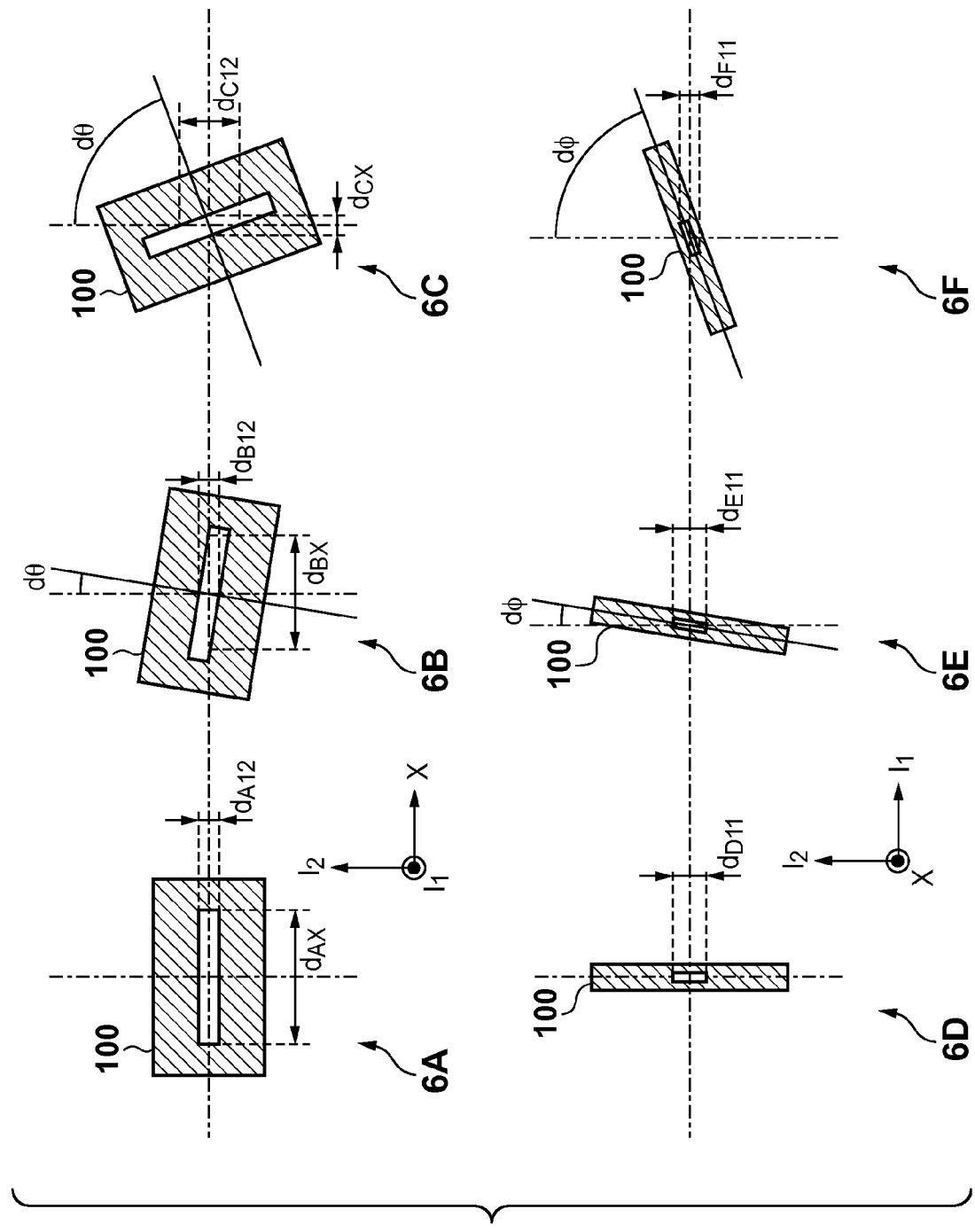
FIG. 6 is a view showing the influence of a rotational shift of the aperture stop.

The present invention aims at suppressing a decrease in spatial coherence along with displacement of the substrate 3 in the direction of height and acquire a high-contrast interference signal. As for the relationship between the shorter side direction of the aperture stop 100 and the direction of the line of intersection of the incident surface and beam cross section, and the relationship between the direction of wavelength resolution and the direction of the line of intersection of the incident surface and beam cross section in the spectral unit 57, which have been described in the first embodiment, these directions need not always coincide with each other if sufficiently high measurement accuracy is obtained. That is, even if a rotational shift on the beam cross section or an angular shift with respect to the optical axis direction occurs slightly, measurement can be performed. In FIG. 6, 6A to 6C are schematic views when a rotational shift on the beam cross section occurs in the aperture stop 100. In FIG. 6, 6D to 6F are schematic views when an angular shift in the optical axis direction occurs on the $I_1$-$I_2$ plane. When a rotational shift dθ occurs on the beam cross section, effective numerical apertures in the $I_2$ direction and X direction change in accordance with the magnitude of dθ. That is, letting dθ be the rotational shift from the $I_2$ direction, a relation of $d_{AX} > d_{BX} > d_{CX}$ is satisfied in the X direction, and a relation of $d_{A12} < d_{B12} < d_{C12}$ is satisfied in the $I_2$ direction. As dθ increases, the numerical aperture in the $I_2$ direction increases and the numerical aperture in the X direction decreases. In FIG. 6, when dθ is equal to or larger than ±45°, the numerical aperture of the aperture stop 100 in the X direction becomes lower than that in the $I_2$ direction. At this time, the longer side direction of the aperture stop 100 is equivalent to the direction of the line of intersection ($I_2$ direction) of the incident surface and beam cross section. No high-contrast interference signal can be acquired, and the measurement accuracy drops. Hence, the rotational shift dθ of the aperture stop 100 on the beam cross section is permitted as long as a requested measurement accuracy and signal strength are satisfied.

Subsequently, an angular shift of the aperture stop 100 with respect to the optical axis direction will be explained with reference to 6D to 6F of FIG. 6. In FIG. 6, 6D to 6F are schematic views when an angular shift dφ on the $I_1$-$I_2$ plane occurs. As the angular shift dφ on the incident surface with respect to the optical axis direction increases, an effective numerical aperture in the $I_2$ direction decreases ($d_{DI1} < d_{EI1} < d_{FI1}$). If the numerical aperture in the direction of the line of intersection ($I_2$ direction) of the incident surface and beam cross section in the aperture stop 100 becomes lower than a numerical aperture which satisfies expression (4) or (5), the signal strength and the contrast of the interference signal decrease. For this reason, the angular shift dϕ on the incident surface with respect to the optical axis direction is permitted as long as a requested measurement accuracy and signal strength are satisfied. Note that the angular shift on the incident surface with respect to the optical axis direction has been described. This also applies to a surface (not shown) other than the incident surface.

As for the spectrometer 50, a rotational shift on the beam cross section and an angular shift with respect to the optical axis direction are considered to occur. In this case, the measurement accuracy for a measurement region on the substrate 3 drops. Hence, the rotational shift of the spectrometer 50 on the beam cross section and the angular shift with respect to the optical axis direction are permitted as long as a requested measurement accuracy and signal strength are satisfied in the measurement region. The first embodiment has so far explained a case in which the aperture stop 100 uses a rectangular slit aperture. However, the shape of the aperture stop 100 is not limited to this and, for example, an elliptical aperture may be used.

According to the first embodiment, the aperture stop 100 having different numerical apertures in two directions perpendicular to each other on the beam cross section of the optical system are arranged. While suppressing a decrease in signal strength, a decrease in spatial coherence is suppressed, and a high-contrast, high-brightness interference signal can be acquired. Along with this, the surface shape of the object 3 can be measured at high accuracy. The first embodiment can provide an interferometer capable of acquiring a high-contrast, high-brightness interference signal, and an interferometer capable of accurately measuring the surface shape of an object to be detected.

Second Embodiment

Figure 7:
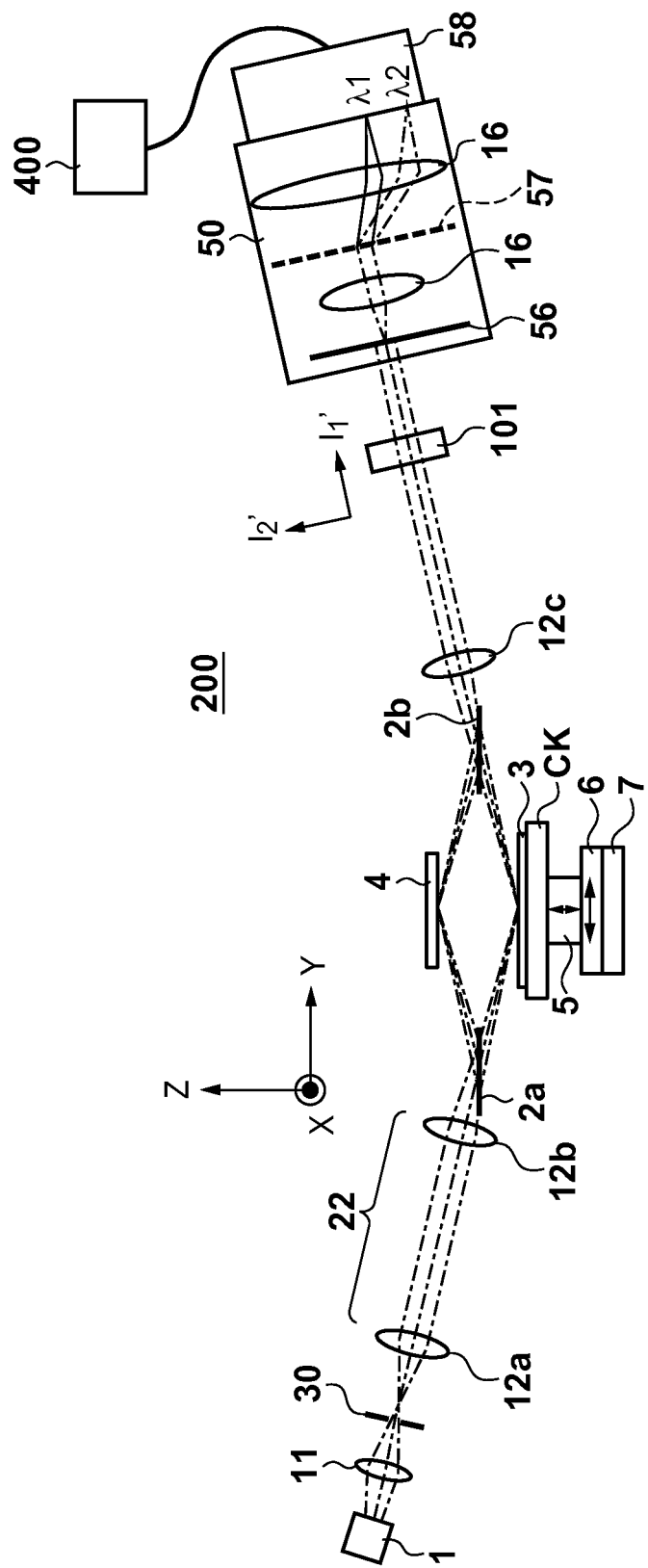
FIG. 7 is a view showing the arrangement of an interferometer according to the second embodiment.

FIG. 7 is a schematic view showing the arrangement of an interferometer 200 in the second embodiment. The second embodiment will explain a case in which a cylindrical lens 101 is used as a spatial coherence generator. The interferometer 200 measures the position of a substrate (wafer) 3 serving as an object to be detected in the direction of height (Z direction). The interferometer 200 includes a light source 1 which emits white light, a condenser lens 11, a transmission slit plate 30, beam splitters 2a and 2b, a reference surface 4, a lens 12, the cylindrical lens 101, a spectrometer 50, a two-dimensional image sensor 58, and a processor 400. Note that the lens 12 represents three lenses 12a, 12b, and 12c shown in FIG. 7.

The functions of the respective building elements will be explained below. Light emitted by the light source 1 is condensed by the condenser lens 11, passes through an imaging optical system 22 constituted by the transmission slit plate 30 and the lenses 12a and 12b, and is branched by the beam splitter 2a. The branched beams are incident on the substrate 3 and reference surface 4, respectively. Measurement light reflected by the substrate 3 and reference light reflected by the reference surface 4 are superimposed by the beam splitter 2b. The superimposed light passes through the lens 12c and cylindrical lens 101, and is guided to the spectrometer 50. The spectrometer 50 is constituted by an incident slit 56, a spectral unit 57 (for example, a diffraction grating), and an imaging optical system 16 (mirror optical system). The spectrometer 50 makes light having passed through the cylindrical lens 101 and incident slit 56 be incident on the diffraction grating 57. The diffraction grating 57 diffracts interfering light once for each wavelength in the shorter side direction of the incident slit 56, obtaining a spectral signal having a spread in the direction of spatial resolution and a spread in the direction of wavelength resolution. The two-dimensional image sensor 58 receives the spectral signal as one-dimensional position information and wavelength information.

The contents of the description in the first embodiment are directly applicable to the light source 1, the beam splitters 2a and 2b, the incident angles of measurement light and reference light, and the two-dimensional image sensor 58 in the second embodiment, and a description thereof will not be repeated. In the second embodiment, the imaging optical system 22 forms, on the substrate 3 and the reference surface 4, a slit image having passed through the transmission slit plate 30. In the second embodiment, the transmission slit plate 30 is installed because it enables surface position measurement at high accuracy by ensuring the light amount, blocking stray light, and defining the measurement range. The substrate 3 is illuminated with, as a slit image (for example, a rectangular, arc, or hexagonal illumination region), white light emitted by the light source 1 through the transmission slit plate 30.

The contents of the description in the first embodiment are directly applicable to the processor 400 which obtains the shape of the substrate 3 by processing a spectral signal received by the two-dimensional image sensor 58, and a description thereof will not be repeated. In the second embodiment, a decrease in spatial coherence along with the positional shift of the object 3 in the direction of height is suppressed to obtain a high-contrast, high-brightness interference signal by using an optical member having different refractive powers in the first and second directions perpendicular to each other on the beam cross section of the optical system. The second embodiment adopts, as the spatial coherence generator, the cylindrical lens 101 having a direction in which the cylindrical lens 101 has refractive powers in the two directions perpendicular to each other on the beam cross section, and a direction in which it does not have a refractive power.

The cylindrical lens 101 is arranged so that the direction in which the cylindrical lens 101 does not have a refractive power coincides with the direction of the line of intersection of the incident surface and beam cross section, and the direction of the line of intersection of the incident surface and beam cross section in the spectral unit 57 coincides with the direction of wavelength resolution. An arrangement when the cylindrical lens 101 is used will be described. As for the relationship between the direction of wavelength resolution, and the direction of the line of intersection of the incident surface and beam cross section in the spectral unit 57, these directions are made to coincide with each other for the reason described in the first embodiment.

First, the direction of the line of intersection of the incident surface and beam cross section, which represents the orientation of the cylindrical lens 101, will be explained. The incident surface means a plane including incident light and reflected light, and represents the Y-Z plane in FIG. 7. The beam cross section means a plane perpendicular to a beam, and represents different planes for the beam cross sections of incident light and reflected light on the substrate 3 in the oblique-incidence interferometer. In FIG. 7, the optical axis direction of light guided to the spectrometer 50 after being reflected by the substrate 3 is defined as an direction. A direction perpendicular to the optical axis direction and X direction is defined as an $I_2'$ direction. The $I_2'$ direction is equivalent to a direction rotated by the incident angle $(180°-\theta_{in})$ from the Y direction on the Y-Z plane. The beam cross section therefore indicates an $I_2'$-X plane defined by the $I_2'$ direction and X direction. Hence, the direction of the line of intersection of the incident surface and beam cross section is the direction of the line of intersection of the Y-Z plane and $I_2'$-X plane, and means the $I_2'$ direction.

In the oblique-incidence interferometer, a vertical shift between reference light and measurement light occurs on the $I_1'$-$I_2'$ plane along with displacement of the substrate 3 in the direction of height. Thus, an angular shift with respect to reference light occurs in measurement light incident on the cylindrical lens 101. FIG. 8 shows the arrangements of the cylindrical lens 101, spectrometer 50, and two-dimensional image sensor 58 on the $I_1'$-$I_2'$ plane and the X-$I_1'$ plane when the direction in which the cylindrical lens 101 does not have a refractive power coincides with the direction of the line of intersection ($I_2'$ direction) of the incident surface and beam cross section. In this case, the substrate 3 and reference surface 4 are not imaged on the incident slit 56 on the $I_1'$-$I_2'$ plane, and blurred point images are formed. As a result, the area by which the reference light and measurement light overlap each other increases, and a decrease in spatial coherence along with displacement of the substrate 3 in the Z direction can be suppressed. If the direction in which the cylindrical lens 101 has a refractive power is made to coincide with the X direction, a slit image formed on the substrate 3 is formed on the incident slit 56 through the lens 12c and cylindrical lens 101 on the X-$I_1'$ plane. On the X-$I_1'$ plane, even if the substrate 3 is displaced in the Z direction, no vertical shift between reference light and measurement light occurs. Thus, interfering light having high spatial coherence can be received in a state in which the substrate 3 and incident slit 56 have an imaging relationship. When the direction in which the cylindrical lens 101 does not have a refractive power is made to coincide with the direction of the line of intersection ($I_2'$ direction) of the incident surface and beam cross section, a high-contrast, high-brightness interference signal can be acquired.

In contrast, when the direction in which the cylindrical lens 101 has a refractive power is made to coincide with the direction of the line of intersection ($I_2'$ direction) of the incident surface and beam cross section, reference light and measurement light superimposed by the beam splitter 2b are incident on the X-$I_1'$ plane in a state in which point images blur. On the X-$I_1'$ plane, no vertical shift between reference light and measurement light occurs, so the signal strength decreases while the spatial coherence remains unchanged. On the $I_1'$-$I_2'$ plane on which a vertical shift between reference light and measurement light occurs, the substrate 3 and incident slit 56 have an imaging relationship, and the spatial coherence decreases along with displacement of the substrate 3 in the direction of height. For this reason, if the direction in which the cylindrical lens 101 has a refractive power is made to coincide with the direction of the line of intersection ($I_2'$ direction) of the incident surface and beam cross section, no high-contrast, high-brightness interference signal can be acquired.

By making the direction in which the cylindrical lens 101 does not have a refractive power coincide with the direction of the line of intersection of the incident surface and beam cross section, a decrease in spatial coherence can be suppressed to perform high-accuracy measurement in the oblique-incidence interferometer. The optical system according to the embodiment uses the cylindrical lens 101, and the substrate 3 and reference surface 4 are not imaged on the incident slit 56 and two-dimensional image sensor 58 in a direction in which a vertical shift of measurement light occurs. The overlapping area is increased to suppress a decrease in spatial coherence.

In the embodiment, the cylindrical lens 101 is arranged in the light receiving optical system, as shown in FIG. 7. However, the cylindrical lens 101 can also be arranged at a position where the lens 12b is arranged in the illumination optical system in FIG. 7. In this case, slit images of the transmission slit plate 30 on the substrate 3 and reference surface 4 are not formed in the image shift direction of reference light and measurement light. After the reference light and measurement light in the image shift direction are reflected, their beam diameters increase until the reference light and measurement light reach the lens 12c of the light receiving optical system. A large light receiving optical system (for example, the lens 12c) corresponding to the widened beams needs to be arranged. The interferometer can therefore be downsized by arranging the cylindrical lens 101 in the light receiving optical system, as shown in FIG. 7. The embodiment has explained a case in which the cylindrical lens 101 is used as an optical member having a refractive power. However, the form of the optical member having a refractive power is not limited to this. In addition to the cylindrical lens, for example, a toric lens is usable.

According to the second embodiment, an optical member having different refractive powers in the first and second directions perpendicular to each other on the beam cross section is arranged to suppress a decrease in spatial coherence. As a result, a high-contrast, high-brightness interference signal can be acquired in interference measurement. Along with this, the surface shape of an object to be detected can be measured at high accuracy. The second embodiment can provide an interferometer capable of acquiring a high-contrast, high-brightness interference signal, and accurately measuring the surface shape of an object to be detected.

Third Embodiment

Figure 9A:
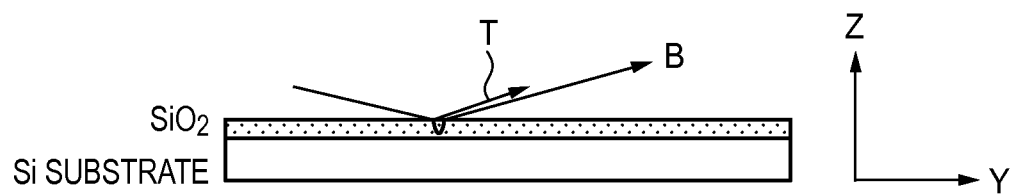
FIGS. 9A to 9C are views showing an example of measurement using an interferometer according to the third embodiment.

An interferometer which measures a film thickness will be explained as the third embodiment of the present invention. The first embodiment has exemplified the interferometer which measures the surface shape (height) of a wafer. The third embodiment will describe an interferometer which measures the film thickness of a semitransparent film formed on a wafer. FIG. 9A shows, as an object to be detected, an example of the structure of a wafer obtained by forming an $SiO_2$ film (1.5 μm) on an Si substrate. As the arrangement of an apparatus in the third embodiment, the interferometer 200 described in the first or second embodiment is directly applied, and a description thereof will not be repeated.

Figure 9B:
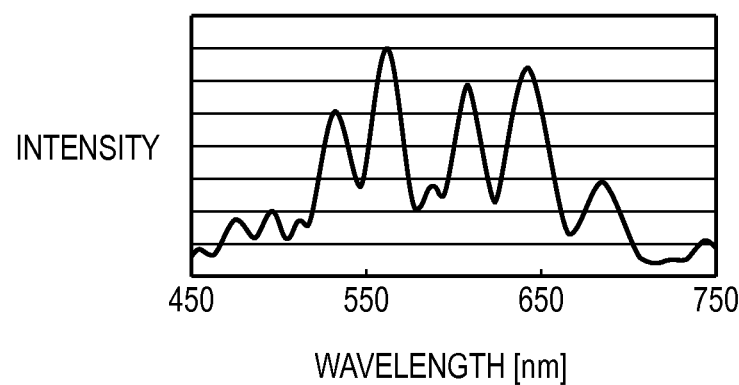
Figure 9C:
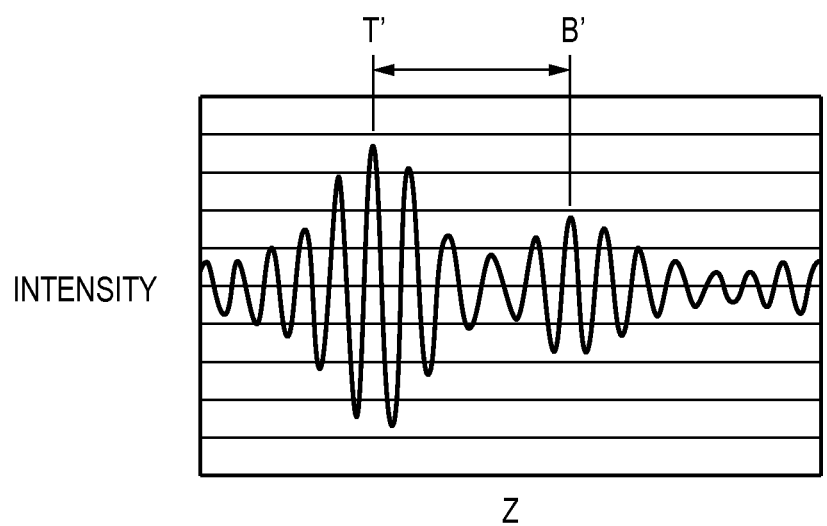

FIG. 9B shows an example of a spectral signal acquired when the object is a sample obtained by forming an $SiO_2$ film (1.5 μm) on an Si substrate. FIG. 9C shows a white light interference signal acquired by performing signal processing shown in FIG. 2 on the spectral signal shown in FIG. 9B. The white light interference signal in FIG. 9C has two peaks T' and B'. As shown in FIG. 9A, these peak positions correspond to a Z position T' at which the optical path length differences of light T reflected by the $SiO_2$ surface and reference light coincide with each other, and a Z position B' at which the optical path length differences of light B reflected at the interface between $SiO_2$ and the Si substrate, and reference light coincide with each other. Letting n be the refractive index of $SiO_2$ and d be the film thickness, the optical path length difference between the reflected light T and the reflected light B is represented by 2nd cos θ. Letting θ be the refractive angle at the air/SiO$_2$ interface, and θ$_{in}$ be the incident angle, the relation of equation (6) is established based on Snell's law:

$$\sin \theta = n \sin \theta_{in} \quad (6)$$

To the contrary, the optical path length difference along with displacement of a wafer 3 is represented by 2(B'−T')cos θ$_{in}$. From the relationship in which the two optical path length differences are equal to each other, the film thickness d is given by:

$$d = (B' - T') \cos \theta_{in}/n \cos \theta \quad (7)$$

Note that the positions B' and T' can be obtained at high accuracy by using a method such as fitting based on a quadratic function, as described in the first embodiment. By constant-speed scanning of a substrate stage WS in the Y direction, the film thickness of a semitransparent film on the wafer 3 can be measured, and the film thickness distribution or the like on the wafer surface can be measured.

Further, the interferometer which measures a film thickness in the third embodiment can use an oblique-incidence white light interferometer. For vertical incidence (incident angle θ=90°), it is difficult to measure the upper surface position of a semitransparent film because the reflectance of light on the upper surface of the semitransparent film is as low as about several %. The intensity of light reflected by the upper surface of the semitransparent film relatively increases as the incident angle increases. With this feature, it is desirable to increase the reflectance of light by increasing the incident angle with respect to the upper surface of the semitransparent film, and obtain a film thickness from the positions of the upper and lower surfaces of the semitransparent film.

Fourth Embodiment

Figure 10:
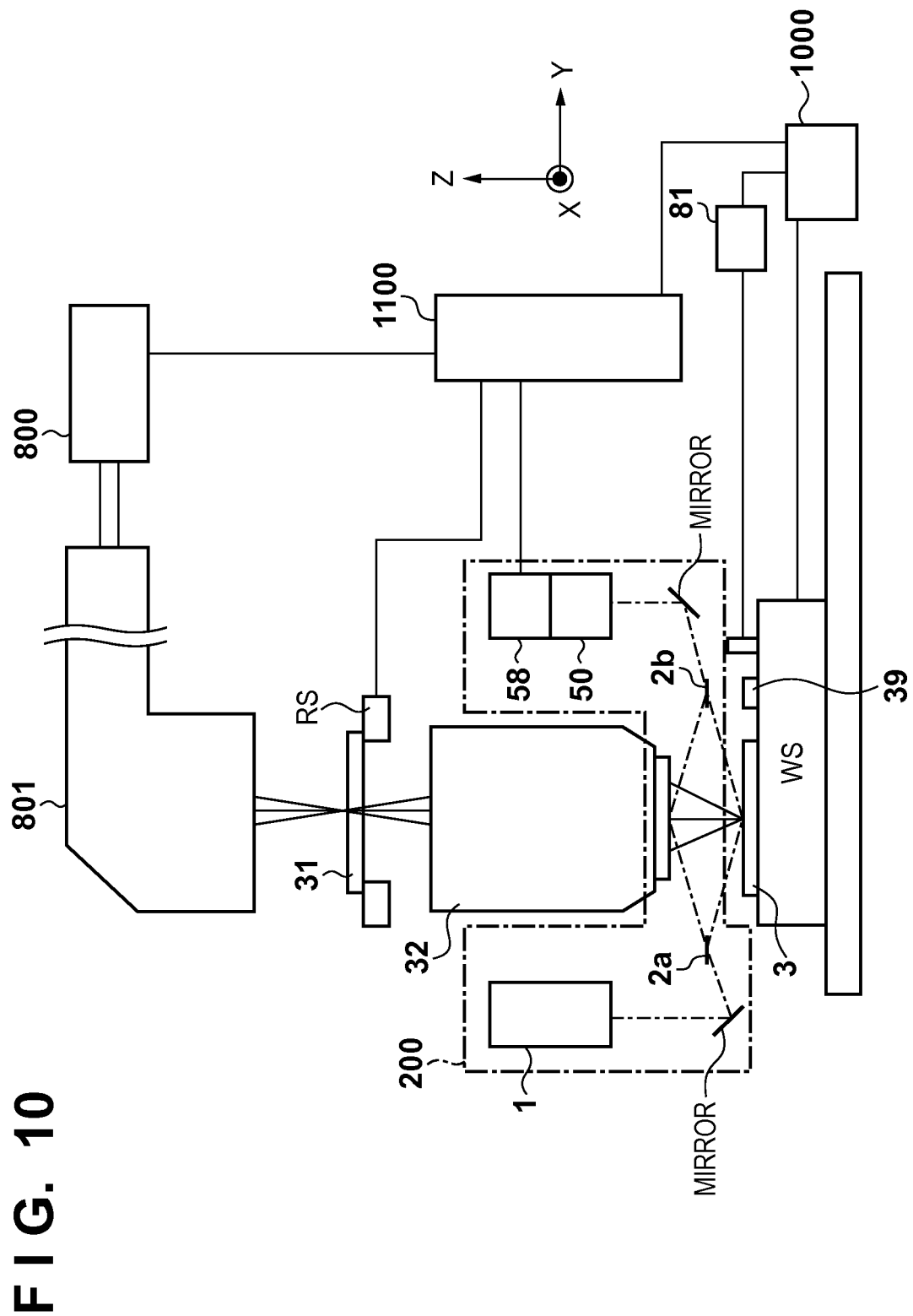
FIG. 10 is a view showing the arrangement of an exposure apparatus according to the fourth embodiment.

FIG. 10 is a block diagram showing an exposure apparatus including an interferometer 200 which measures a surface shape according to the present invention. As shown in FIG. 10, the exposure apparatus includes a light source unit 800, a reticle stage RS on which a reticle 31 is placed, a projection optical system 32, a wafer stage (substrate stage) WS which holds a wafer (substrate) 3, and a reference plate 39 arranged on the wafer stage WS. In addition, the exposure apparatus includes the interferometer 200 which measures a surface shape. The first or second embodiment is applicable to the interferometer 200. A control unit 1100 includes a CPU and memory, is electrically connected to the light source unit 800, the reticle stage RS, the wafer stage WS serving as a substrate stage, and the interferometer 200, and controls the operation of the exposure apparatus. In the embodiment, the control unit 1100 can perform calculation and control of the surface position measurement value of the wafer 3 in the interferometer 200, and correction calculation and control of a measurement value when detecting a surface position. Note that the interferometer 200 according to the present invention can be used to measure the surface shape of the wafer 3 in a lithography apparatus other than the exposure apparatus, such as a charged particle beam drawing apparatus or imprint apparatus.

The illumination system illuminates the reticle 31 on which a circuit pattern to be transferred is formed. The illumination system includes the light source unit 800 and an illumination optical system 801. The light source unit 800 uses, for example, a laser. The laser can be an ArF excimer laser having a wavelength of about 193 nm, or a KrF excimer laser having a wavelength of about 248 nm. However, the type of light source is not limited to the excimer laser. More specifically, an F$_2$ laser having a wavelength of about 157 nm or EUV (Extreme UltraViolet) light having a wavelength of 20 nm or less may be used.

The illumination optical system 801 is an optical system which illuminates a surface to be illuminated by using a beam emitted by the light source unit 800. In the embodiment, the illumination optical system 801 shapes a beam into an exposure slit of a predetermined optimum shape, and illuminates the reticle 31. The illumination optical system 801 includes a lens, mirror, optical integrator, stop, and the like. For example, a condenser lens, fly-eye lens, aperture stop, condenser lens, slit, and imaging optical system are arranged in the order named.

The reticle 31 serving as an original is made of, for example, quartz. A circuit pattern to be transferred is formed on the reticle 31, and the reticle 31 is supported and driven by the reticle stage RS. Diffracted light traveling from the reticle 31 passes through the projection optical system 32 and is projected on the wafer 3. The reticle 31 and wafer 3 are arranged in an optically conjugate relationship. The reticle 31 and wafer 3 are scanned at a velocity ratio corresponding to a reduction magnification ratio, thereby transferring the pattern of the reticle 31 onto the wafer 3. Note that the exposure apparatus includes the reticle detector of a light oblique-incidence system (not shown). The reticle detector detects the position of the reticle 31, and the reticle 31 is arranged at a predetermined position.

The reticle stage RS supports the reticle 31 via a reticle chuck (not shown), and is connected to a moving mechanism (not shown). The moving mechanism is constituted by a linear motor or the like, and can move the reticle 31 by driving the reticle stage RS in the X-axis direction, Y-axis direction, Z-axis direction, and rotational directions about the respective axes.

The projection optical system 32 has a function of projecting, on the image plane, a beam traveling from the object plane. In the embodiment, the projection optical system 32 projects, onto the wafer 3, diffracted light having passed through the pattern formed on the reticle 31. The projection optical system 32 can use an optical system constituted by a plurality of lens elements, an optical system (catadioptric optical system) including a plurality of lens elements and at least one concave mirror, an optical system including a plurality of lens elements and a diffraction optical element such as at least one kinoform, or the like.

A photoresist serving as an object to be processed is applied on the wafer 3 serving as a substrate. In the embodiment, the wafer 3 is also an object to be detected whose surface position is detected by the interferometer 200. In another embodiment, the wafer 3 is replaced with a liquid crystal substrate or another substrate.

The wafer stage WS supports the wafer 3 by a wafer chuck (not shown). Similar to the reticle stage RS, the wafer stage WS uses a linear motor to move the wafer 3 in the X-axis direction, Y-axis direction, Z-axis direction, and rotational directions about the respective axes. For example, a 6-axis laser interferometer 81 or the like monitors the positions of the reticle stage RS and wafer stage WS, and the reticle stage RS and wafer stage WS are driven at a predetermined velocity ratio.

The measurement point of the surface position (focus) of the wafer 3 will be explained. In the embodiment, while scanning the wafer stage WS in the scanning direction (Y direction) in the entire region of the wafer 3, the interferometer 200 measures a wafer surface position, and the stage WS is step-moved by ΔX in a direction (X direction) perpendicular to the scanning direction. Subsequently, the surface position of the wafer 3 is measured in the scanning direction. By repeating this operation, shape measurement of the entire surface of the wafer is performed. To increase the throughput, a plurality of interferometers 200 may be used to simultaneously measure the surface positions of different points on the wafer. It is also possible to make beams incident on a plurality of measurement points on the wafer, guide the respective beams to individual sensors, and calculate the tilt of a surface to be exposed from pieces of height measurement information of the different positions.

Next, an exposure method using the exposure apparatus of the present invention having the above arrangement will be explained in detail. FIG. 11 is a flowchart showing the overall sequence of the exposure method when the exposure apparatus according to the embodiment is used. First, in step S1, the wafer 3 is loaded into the apparatus. In step S101, wafer alignment is performed on the wafer 3. In wafer alignment, the position of a mark on the wafer is detected by an alignment scope (not shown) to align the X-Y plane of the wafer 3 with respect to the exposure apparatus. Then, in step S102, the interferometer 200 measures the surface position of a predetermined portion on the wafer 3, and surface shape data of the wafer 3 is saved in the exposure apparatus. In step S102, the wafer stage WS moves the wafer 3 from a position below the interferometer 200 so that the first exposure shot is located at an exposure position below the projection optical system 32. At the same time, the control unit 1100 of the exposure apparatus creates surface position data of the first exposure shot based on the surface shape data of the wafer 3 as the surface position measurement result, and calculates a shift amount from the exposure image plane. An operation of adjustment to the position of the wafer surface in the direction of height for almost each exposure slit by stage driving in the Z direction and tilt direction based on the shift amount from the exposure image plane is performed. In step S103, focusing and tilt correction are performed based on the measurement result in step S102.

In step S104, exposure and scanning of the wafer stage WS in the Y direction are performed. After the end of exposing the first exposure shot, it is determined in step S105 whether there is an unexposed shot. If there is an unexposed shot, the process returns to step S102. Similar to the first exposure shot, the processor 400 creates surface position data of the next exposure shot. Exposure is performed while performing an operation of adjustment to the shape of the wafer surface in the direction of height for almost each exposure slit by stage driving in the Z direction and tilt direction. In step S105, it is determined whether there is a shot to be exposed (that is, an unexposed shot). The above-described operation is repeated until all shots are exposed. After the end of exposing all exposure shots, the wafer 3 is recovered in step S106, and the process ends.

The wafer stage WS is not limited to a single stage, and may be a so-called twin-stage arrangement including two stations, that is, an exposure station which performs exposure processing and a measurement station which performs measurement processing such as alignment of the wafer 3 and measurement of the surface position. In the twin-stage exposure apparatus, the two stages are alternated between the exposure station and the measurement station. In this case, the interferometer 200 is arranged on the measurement station side.

Since a complicated circuit pattern, scribe line, and the like exist on a wafer serving as a substrate to be measured or processed by the exposure apparatus, the rate of occurrence of the reflectance distribution, local tilt, or the like is high. Thus, measurement of a high-accuracy surface position using the white light interferometer capable of reducing a measurement error generated by the reflectance distribution or local tilt is an important technique. To measure a surface shape quickly at high accuracy by using the white light interferometer, the effect of the present invention regarding the coherence between reference light and measurement light is significant. If the shape of the wafer surface can be measured quickly at high accuracy, the focusing accuracy of an optimum exposure surface and wafer surface is increased. This leads to high performance of a semiconductor element and high manufacturing yield.

The embodiment has described only a case in which the present invention is applied as the interferometer 200 in the exposure apparatus. However, the present invention is not limited to the interferometer 200, and may be applied as a focus calibration apparatus which performs focus calibration of the interferometer 200. The focus calibration apparatus can perform focus calibration by measuring the surface position at high accuracy by using the spatial coherence generator, as in the interferometer 200.

According to the fourth embodiment, a decrease in the spatial coherence between reference light and measurement light is suppressed by using the spatial coherence generator having different spatial coherences in the first and second directions perpendicular to each other on the beam cross section. As a result, a high-contrast, high-brightness interference signal can be obtained in interference measurement. Along with this, the surface position of a substrate can be measured at high accuracy. The fourth embodiment can provide an exposure apparatus which implements high focus accuracy at a small focal depth and increases the yield.

Although the embodiments of the present invention have been described, the present invention is not limited to these embodiments and is widely applied to a spectral oblique-incidence white light interferometer which makes light obliquely incident on an object to be detected, and acquires physical information, chemical information, and optical information of the object based on the acquired spectral interference signal.

[Method of Manufacturing Article]

A method of manufacturing an article according to the embodiment of the present invention is suitable for manufacturing an article such as a microdevice (for example, a semiconductor device) or an element having a microstructure. The manufacturing method includes a step of forming a pattern on a substrate by using a lithography apparatus. Further, the manufacturing method includes other well-known steps (for example, oxidization, deposition, vapor deposition, doping, planarization, etching, resist removal, dicing, bonding, and packaging) of processing the pattern-formed substrate. The method of manufacturing an article according to the embodiment is superior to a conventional method in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-152096, filed Jul. 22, 2013, which is hereby incorporated by reference herein in its entirety.

What is claimed is:

1. An interferometer comprising:
   an optical system configured to generate interfering light by dividing light from a light source, and combining reference light generated by reflecting one beam of the divided light by a reference surface, and measurement light generated by making the other beam of the divided light obliquely incident on an object to be detected and reflecting the other beam by the object;
   a detector configured to detect the interfering light generated by the optical system;
   an optical member configured to give spatial coherence to the light from the light source before the detector detects the light from the light source; and
   a spectral unit configured to disperse the interfering light generated by the optical system,
   wherein the optical member gives higher spatial coherence in a second direction serving as a direction of a line of intersection of a cross section of a beam of the light incident on the optical member, and a plane including optical paths of the light from the light source before being divided by the optical system, the reference light, the measurement light, and the interfering light, than in a first direction perpendicular to the plane, and
   wherein the spectral unit makes a direction of wavelength resolution parallel to the second direction.

2. The interferometer according to claim 1, wherein the optical member includes an aperture stop configured to form an aperture having different lengths in the first direction and the second direction.

3. The interferometer according to claim 2, wherein the aperture stop is arranged at, of the optical system, a pupil position of an illumination optical system configured to make the light incident on the object from the light source.

4. The interferometer according to claim 2, wherein the optical system is configured to generate interfering light by dividing broadband light,
   wherein letting $\lambda c$ be a center wavelength of the broadband light, $\theta_{in}$ be an incident angle with respect to the object, and Zr be a measurement range of the object in the second direction, a numerical aperture NA decided by a shorter side direction of the aperture of the aperture stop satisfies $NA \leq 0.61\lambda c/(Zr \cdot \sin \theta_{in})$.

5. The interferometer according to claim 2, wherein the optical system configured to generate interfering light by dividing broadband light,
   wherein letting $\lambda c$ be a center wavelength of the broadband light, $\theta_{in}$ be an incident angle with respect to the object, and Zr be a measurement range of the object in the second direction, a numerical aperture NA decided by a shorter side direction of the aperture of the aperture stop satisfies $NA \leq 0.305\lambda c/(Zr \cdot \sin \theta_{in})$.

6. The interferometer according to claim 1, wherein the optical member has different refractive powers in the first direction and the second direction.

7. The interferometer according to claim 6, wherein the optical member includes a cylindrical lens.

8. The interferometer according to claim 6, wherein the optical member is arranged in, of the optical system, a light receiving optical system configured to guide the measurement light and the reference light to the detector.

9. The interferometer according to claim 1, wherein the spectral unit includes one of a diffraction grating and a dispersing prism.

10. The interferometer according to claim 1, wherein the detector includes a two-dimensional image sensor.

11. The interferometer according to claim 10, further comprising:
    a stage configured to move while supporting the object; and
    a control unit configured to control the stage,
    wherein the control unit controls the stage to move the object during image sensing of one frame of the two-dimensional image sensor.

12. The interferometer according to claim 1, wherein an incident angle of the light from the light source with respect to the object is not smaller than 60°.

13. The interferometer according to claim 1, wherein the interferometer measures a surface shape of the object.

14. The interferometer according to claim 1, wherein the object includes a substrate on which a semitransparent film is formed, and the interferometer measures a film thickness of the semitransparent film.

15. The interferometer according to claim 1, wherein the optical system is configured to generate interfering light by dividing broadband light.

16. The interferometer according to claim 1, wherein the headband light includes white light.

17. A lithography apparatus which forms a pattern on a substrate, the apparatus comprising:
    a substrate stage configured to hold the substrate; and
    an interferometer configured to measure a surface shape of the substrate held by the substrate stage,
    the interferometer including:
      an optical system configured to generate interfering light by dividing light from a light source, and combining reference light generated by reflecting one beam of the divided light by a reference surface, and measurement light generated by making the other beam of the divided light obliquely incident on an object to be detected and reflecting the other beam by the object;
      a detector configured to detect the interfering light generated by the optical system;
      an optical member configured to give spatial coherence to the light from the light source before the detector detects the light from the light source; and
      a spectral unit configured to disperse the interfering light generated by the optical system,
      wherein the optical member gives higher spatial coherence in a second direction serving as a direction of a line of intersection of a cross section of a beam of the light incident on the optical member, and a plane including optical paths of the light from the light source before being divided by the optical system, the reference light, the measurement light, and the interfering light, than in a first direction perpendicular to the plane, and
      wherein the spectral unit makes a direction of wavelength resolution parallel to the second direction.

18. The apparatus according to claim 17, wherein
    the lithography apparatus includes an exposure apparatus including a measurement station configured to perform measurement processing of measuring a substrate, and an exposure station configured to perform exposure processing on the substrate having undergone the measurement processing, and
    the interferometer is arranged in the measurement station.

19. A method of manufacturing an article, the method comprising:
    forming a pattern on a substrate by using a lithography apparatus; and processing the substrate on which the pattern has been formed to manufacture the article, the lithography apparatus comprising:
- a substrate stage configured to hold the substrate; and
- an interferometer configured to measure a surface shape of the substrate held by the substrate stage, the interferometer including:
    - an optical system configured to generate interfering light by dividing light from a light source, and combining reference light generated by reflecting one beam of the divided light by a reference surface, and measurement light generated by making the other beam of the divided light obliquely incident on an object to be detected and reflecting the other beam by the object;
    - a detector configured to detect the interfering light generated by the optical system;
    - an optical member configured to give spatial coherence to the light from the light source before the detector detects the light from the light source; and
    - a spectral unit configured to disperse the interfering light generated by the optical system,
    wherein the optical member gives higher spatial coherence in a second direction serving as a direction of a line of intersection of a cross section of a beam of the light incident on the optical member, and a plane including optical paths of the light from the light source before being divided by the optical system, the reference light, the measurement light, and the interfering light, than in a first direction perpendicular to the plane, and
    wherein the spectral unit makes a direction of wavelength resolution parallel to the second direction.

* * * * *